(12) United States Patent
Ishihara et al.

(10) Patent No.: US 8,063,553 B2
(45) Date of Patent: Nov. 22, 2011

(54) ORGANIC ELECTROLUMINESCENCE DISPLAY DEVICE AND METHOD OF MANUFACTURING THE SAME

(75) Inventors: Shingo Ishihara, Mito (JP); Eiji Matsuzaki, Yokohama (JP); Hiroshi Kageyama, Hachioji (JP)

(73) Assignee: Hitachi Displays, Ltd., Chiba (JP)

( * ) Notice: Subject to any disclaimer, the term of this patent is extended or adjusted under 35 U.S.C. 154(b) by 840 days.

(21) Appl. No.: 12/041,724

(22) Filed: Mar. 4, 2008

(65) Prior Publication Data

US 2008/0218065 A1  Sep. 11, 2008

(30) Foreign Application Priority Data

Mar. 5, 2007  (JP) .................. 2007-054456

(51) Int. Cl.
*H01L 51/50* (2006.01)
*H01L 51/52* (2006.01)
*H01L 51/56* (2006.01)

(52) U.S. Cl. ........ 313/503; 313/500; 313/505; 313/506; 315/169.3; 445/24; 427/96.8; 427/109

(58) Field of Classification Search .......... 313/500–512; 315/169.2–169.4; 445/24; 427/58, 96, 109
See application file for complete search history.

(56) References Cited

U.S. PATENT DOCUMENTS

| 2003/0137325 A1* | 7/2003 | Yamazaki et al. ............... 327/80 |
| 2007/0013293 A1* | 1/2007 | Cok ............................... 313/504 |
| 2007/0205717 A1* | 9/2007 | Yasukawa ..................... 313/506 |

FOREIGN PATENT DOCUMENTS

| CN | 1434668 | 8/2003 |
| JP | 2001-230086 | 8/2001 |
| JP | 2003-288997 | 10/2003 |

* cited by examiner

*Primary Examiner* — Mariceli Santiago
(74) *Attorney, Agent, or Firm* — Antonelli, Terry, Stout & Kraus, LLP.

(57) ABSTRACT

To reduce brightness variation by wiring resistance of an upper part transparent electrode in an organic luminescence element, a stripe-shape first auxiliary wiring 11 extending in a direction parallel to a signal line is formed on the upper part transparent electrode, by a precise mask vapor deposition method. Then, a stripe-shape second auxiliary wiring 12 extending in a direction parallel to a scanning line is formed by a precise mask vapor deposition method.

18 Claims, 21 Drawing Sheets

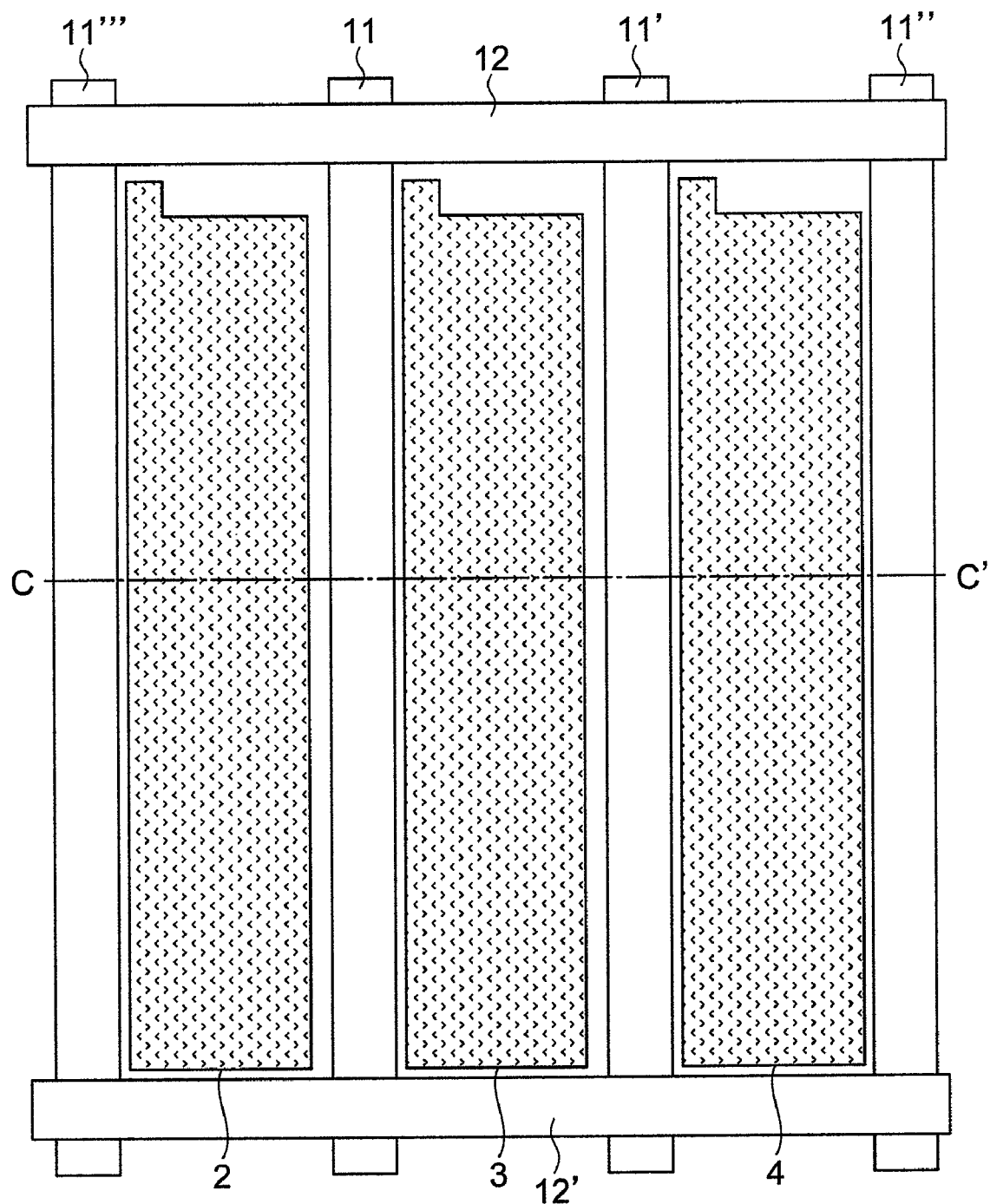

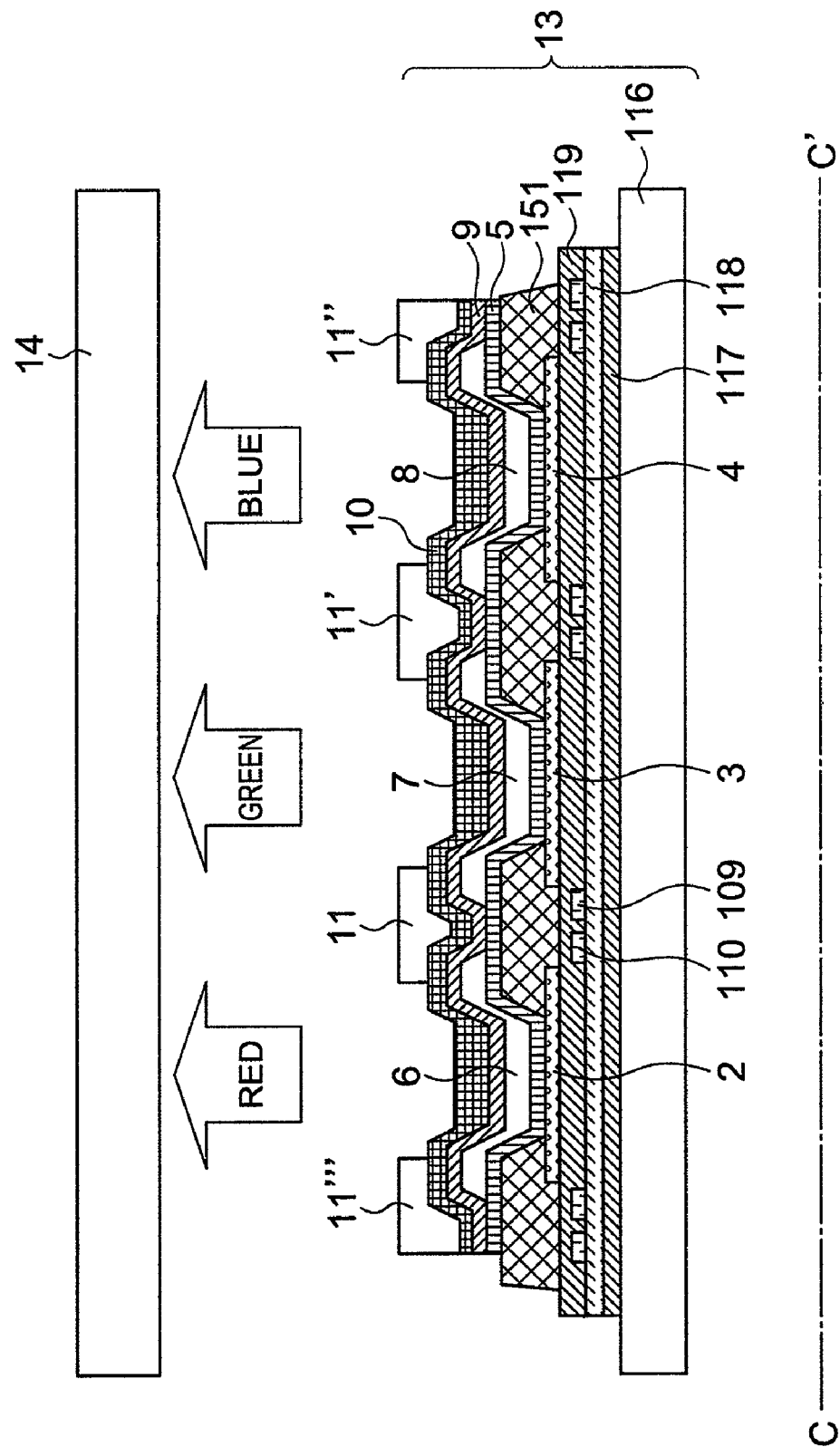

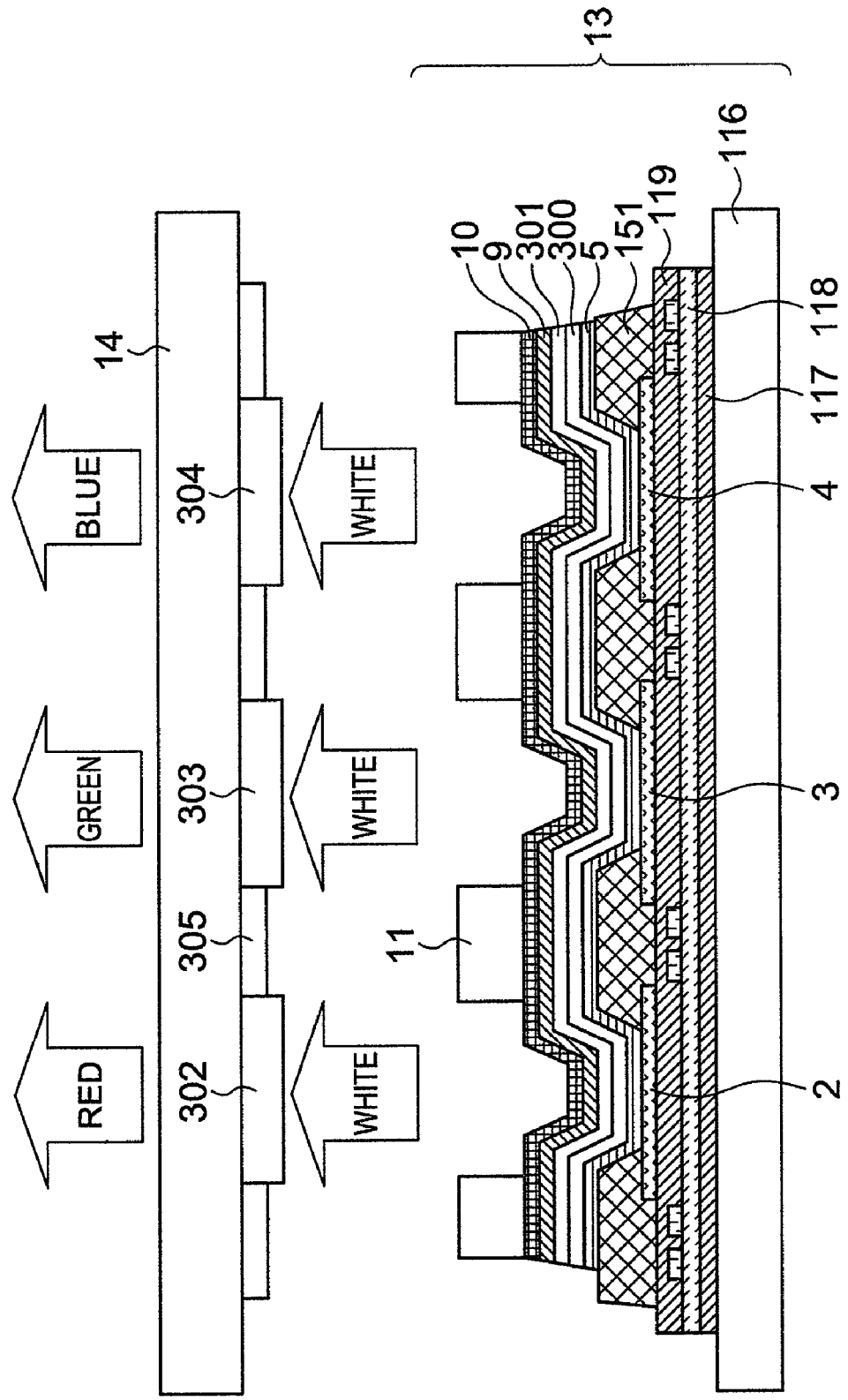

ORGANIC ELECTROLUMINESCENCE DISPLAY DEVICE AND METHOD OF MANUFACTURING THE SAME

BACKGROUND OF THE INVENTION

The present invention relates to an organic electroluminescence display device having reduced brightness variation and a method of manufacturing the same.

A self-luminous organic electroluminescence element (hereafter referred to as "an organic luminescence element") is expected as a flat-panel display device, or for lighting of a liquid crystal display device.

In general, an upper part transparent electrode of an organic luminescence element is used as a common electrode. Thus, a current of a whole panel flows through the upper part transparent electrode, and thereby each of luminescence elements produces luminescence. Therefore, in the case where a transparent conducive film having a high resistance is used as the upper part transparent electrode, variation of applied voltage is induced in a pixel composed of an organic luminescence element at the circumference part of the panel near a power source, and a pixel composed of an organic luminescence element at the central part of the panel, by wiring resistance of the upper part transparent electrode, resulting in generation of brightness variation.

In JP-A-2001-230086 and JP-A-2003-288994, there is described that, in an organic electroluminescence display device, an auxiliary wiring is formed mainly at the lower part of an upper part transparent electrode. In addition, it is also described that the auxiliary wiring is formed at the upper part of the upper part transparent electrode.

SUMMARY OF THE INVENTION

In an organic electroluminescence display device, a connection of an auxiliary wiring is required in an upper part transparent electrode. In the case where the auxiliary wiring is formed, for example, in a stripe-shape in a direction parallel to a signal line, brightness variation generates between pixels adjacent in a direction parallel to a signal line. This is because voltage drop varies depending on a lighting state of a pixel in a direction parallel to the signal line. Therefore, the auxiliary wiring is required to be formed not in a stripe-shape but in a lattice-shape.

It is an object of the present invention to provide a high-quality display device by reducing brightness variation in a panel by wiring resistance of the upper part transparent electrode, in an organic electroluminescence display device using an organic luminescence element having an upper part transparent electrode. In addition, it is an object of the present invention to provide a pixel structure which is capable of easily performing an auxiliary wiring forming method using a precise mask vapor deposition method. In particular, it is an object of the present invention to provide an element arrangement of a driving layer accompanied with the above pixel structure.

The present invention is characterized in that a first auxiliary wiring extending in a direction parallel to a signal line and a second auxiliary wiring extending in a direction parallel to a scanning line are provided on an upper part transparent electrode of a plurality of organic luminescence elements, and the first auxiliary wiring and the second auxiliary wiring are formed in a lattice-shape, so as to surround a sub-pixel composed of one organic luminescence element, or a pixel composed of a plurality of the organic luminescence elements.

The signal line and a first current supply line are arranged at the lower side of the first auxiliary wiring that surrounds the sub-pixel, and a scanning line is arranged at the lower side of the second auxiliary wiring that surrounds the sub-pixel. In addition, an upper part electrode of a capacitance is arranged at the lower side of the first current supply line.

A space is disposed at the lower side of the first auxiliary wiring that surrounds the pixel, and a scanning line is arranged at the lower side of the second auxiliary wiring that surrounds the pixel.

The first current supply line is arranged at the lower side of the first auxiliary wiring that surrounds the pixel, and the scanning line and the second current supply line are arranged at the lower side of the second auxiliary wiring that surrounds the pixel, and the first current supply line and the second current supply line are connected. In addition, an electrical connection layer is formed at the first auxiliary wiring and the second auxiliary wiring. Further, an upper electrode of a capacitance is arranged between the scanning line and the second current supply line.

In addition, the present invention is characterized by using a precise vapor deposition mask with a stripe-shape in order to form the first auxiliary wiring and the second auxiliary wiring. In particular, the first auxiliary wiring, the second auxiliary wiring and the electrical connection layer are formed, by using the precise vapor deposition mask.

As described above, an organic electroluminescence display device relevant to the present invention is capable of providing high quality display, because an auxiliary wiring of the upper part transparent electrode is formed in a lattice-shape, which reduces brightness variation in a panel. In addition, it is capable of preventing reduction of performance of an organic luminescence element, due to formation by a vapor deposition method using a precise mask.

Other objects, features and advantages of the invention will become apparent from the following description of the embodiments of the invention taken in conjunction with the accompanying drawings.

BRIEF DESCRIPTION OF THE DRAWINGS

FIG. 2 is a plan view of a pixel in an organic electroluminescence display device (Embodiment 1).

FIG. 4 is a cross-sectional view along the C-C' line of FIG. 1 and FIG. 2 (Embodiment 1).

FIG. 21 is a plan view of a pixel in an organic electroluminescence display device (Embodiment 20).

DETAILED DESCRIPTION OF THE EMBODIMENTS

Figure 1:
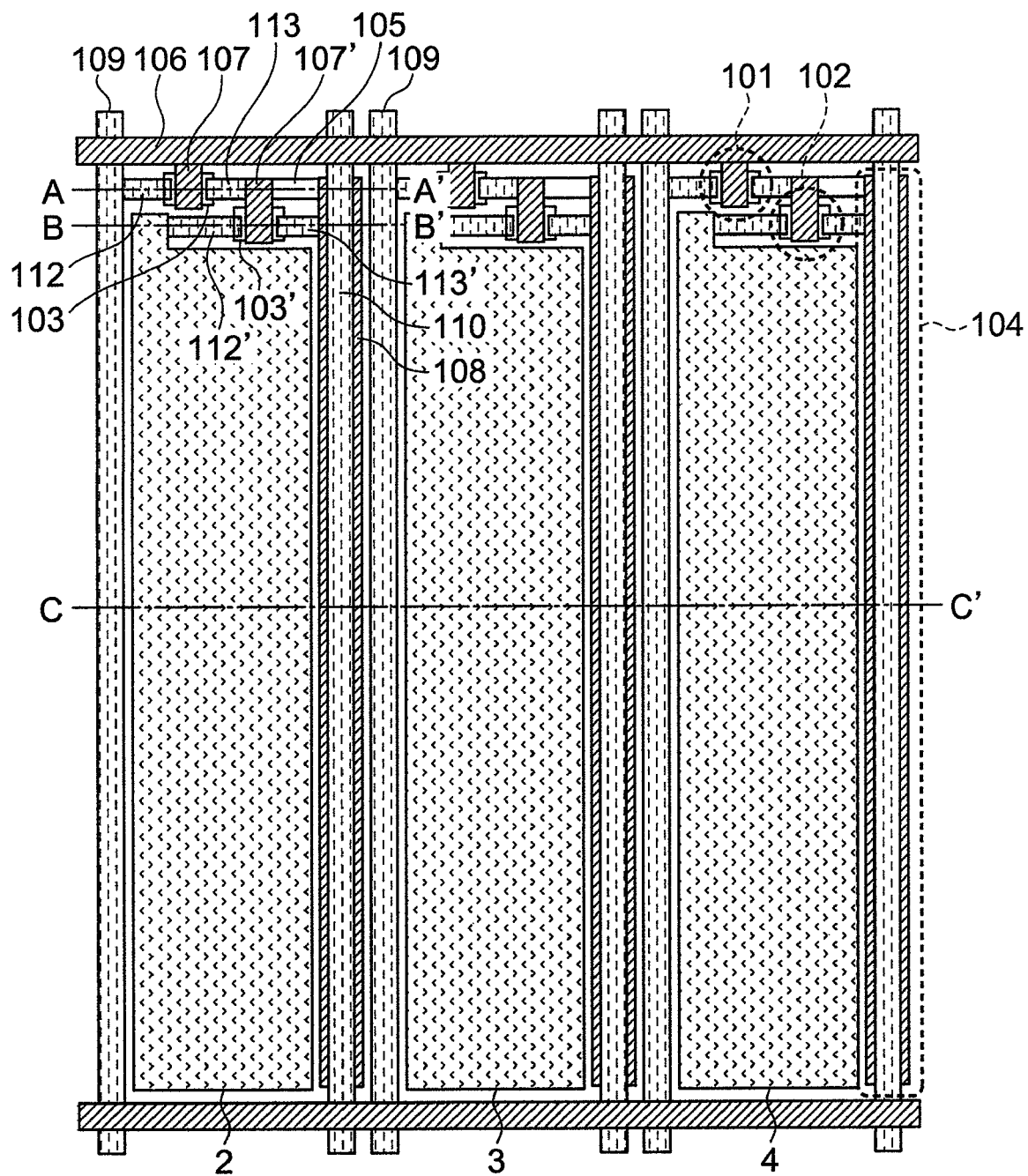
FIG. 1 is a plan view of a pixel in an organic electroluminescence display device (Embodiment 1).

Hereafter, in the present invention, "an organic luminescence element" means one having the following structure. That is, it is composed of, in the order of a substrate/a lower part electrode/a first injection layer/a first transport layer/a luminescence layer/a second transport layer/a second injection layer/an upper part electrode/a protecting layer or a shielding substrate (an opposed substrate).

There are two combinations for the lower part electrode and the upper part electrode. Firstly, it is a constitution where the lower part electrode is an anode, and the upper part electrode is a cathode. In this case, the first injection layer and the first transport layer are a hole injection layer and a hole transport layer, respectively. In addition, the second transport layer and the second injection layer are an electron transport layer and an electron injection layer, respectively.

Other combination is a constitution where the lower part electrode is a cathode and the upper part electrode is an anode. In this case, the first injection layer and the first transport layer are an electron injection layer and an electron transport layer, respectively. In addition, the second transport layer and the second injection layer are a hole transport layer and a hole injection layer, respectively.

In the above constitution, it is also considered a structure not having the first injection layer or the second injection layer. In addition, it is also considered a structure where the first transport layer or the second transport layer is combined with the luminescence layer.

In the upper part electrode and the lower part electrode, a desirable combination is that one electrode is transparent to emitted light and the other electrode is reflective to emitted light. In this case, because light is taken out from the electrode having light transparency, that electrode is called a transparent electrode. On the other hand, an electrode having reflective property is called a reflecting electrode.

In the case where the upper part electrode is the transparent electrode, it is called a top-emission structure. On the other hand, in the case where the lower part electrode is a transparent electrode, it is called a bottom-emission structure.

"A substrate" referred to here can be selected from a wide range of materials, as long as being an insulating material. Specifically, an inorganic material such as glass, an alumina sintered body, and various kinds of insulating plastics such as a polyimide film, a polyester film, a polyethylene film, a polyphenylene sulfide film, a polyparaxylene film, and the like can be used.

In addition, even a metallic material has no problem, as long as the insulating material is formed on the surface thereof. Specifically, stainless steel, aluminum, copper, and an alloy containing the above metal are included, but it is not limited to these materials.

"An anode" referred to here is desirably a conducting film having large work function for enhancing the injection efficiency of holes. Specifically, gold and platinum are included, but it is not limited to these materials.

In addition, as "an anode", it may be a binary compound such as indium-tin oxide (ITO), indium-zinc oxide (IZO), indium-germanium oxide, or a ternary compound such as indium-tin-zinc oxide. In addition, other than indium oxide, it may be a composition having tin oxide, zinc oxide or the like, as a major component. In addition, in the case of ITO, a composition containing tin oxide in an amount of from 5 to 10% by weight relative to indium oxide, is often used. Methods of manufacturing the oxide semiconductor include a sputtering method, an EB vapor deposition method, and an ion plating method or the like.

The work functions of an ITO film and an IZO film are 4.6 eV and 4.6 eV, respectively, but it can be increased up to about 5.2 eV, by UV-ozone irradiation, oxygen-plasma treatment or the like.

The ITO film becomes a polycrystalline state when prepared by the sputtering method under condition of an increased substrate temperature of up to about 200° C. Since surface flatness is poor because of the crystal grains in the polycrystalline state, it is desirable to use one having a polished surface. In addition, as other methods, it is desirable to use one changed to a polycrystalline state by heating one formed in an amorphous state.

In addition, by providing the hole injection layer, use of a usual conducting film may be enough as the anode, without requiring use of a material having large work function.

Specifically, a desirable material includes a metal such as aluminum, indium, molybdenum, nickel and an alloy using these metals, or an inorganic material such as polysilicon, amorphous silicon, tin oxide, indium oxide, indium-tin oxide (ITO).

In addition, an organic material such as polyaniline, polythiophene, formed by a coating method being a simple formation process, or conductive ink is desirable. In addition, of course, it is not limited to these materials, and two or more kinds of these materials may be used in combination.

As "a hole injection layer" referred to here, a material having suitable ionization potential is desirable, in order to lower the injection barrier of the anode and the hole transport layer. In addition, it is desirable to play a role of filling surface irregularity of a ground layer. Specifically, copper phthalocyanine, starburst amine compound, polyaniline, polythiophene, vanadium oxide, molybdenum oxide, ruthenium oxide, aluminum oxide or the like is included, but it is not limited thereto.

"A hole transport layer" referred to here has a role of transporting holes and injecting them into a luminescence layer. Therefore, it is desirable to be made of a hole transport material having high hole mobility. In addition, it is desirable to be chemically stable, to have an ionization potential between one of hole injection materials and one of luminescence host materials, to have a small electron affinity, and to have a high glass transition temperature. Specifically, it is desirable to be N,N'-bis(3-methylphenyl)-N,N'-diphenyl-[1,1'-biphenyl]-4,4'-diamine (TPD), 4,4'-bis-[N-(1-naphthyl)N-phenylamino]biphenyl (α-NPD), 4,4',4"-tri-(N-carbazolyl)triphenylamine (TCTA), 1,3,5-tris[N-(4-diphenylaminophenyl)phenylamino]benzene (p-DPA- TDAB), 4,4',4"-tris(N-carbazol)triphenylamine (TCTA), 1,3,5-tris[N,N-bis(2-methylphenyl)-amino]-benzene (o-MTDAB), 1,3,5-tris[N,N-bis(3-methylphenyl)-amino]-benzene (m-MTDAB), 1,3,5-tris[N,N-bis(4-methylphenyl)-amino]-benzene (p-MTDAB), 4,4',4"-tris[1-naphthyl(phenyl)amino]triphenylamine (1-TNATA), 4,4',4"-tris[2-naphthyl-(phenyl)amino]triphenylamine (2-TNATA), 4,4',4"-tris-[bi-phenyl-4-yl-(3-methylphenyl)amino]triphenylamine (p-PMTDATA), 4,4',4"-tris[9,9-dimethylfluorene-2-yl-(phenyl)amino]triphenylamine (TFATA), 4,4',4"-tris(N-carbazolyl)triphenylamine (TCTA), 1,3,5-tris-[N-(4-diphenylaminophenyl)phenylamino]benzene (p-DPA-TDAB), 1,3,5-tris{4-[methylphenyl(phenyl)amino]phenyl}benzene (MTDAPB), N,N'-di(biphenyl-4-yl)-N,N'-diphenyl-[1,1'-biphenyl]-4,4'-diamine (p-BPD), N,N'-bis(9,9-dimethylfluorene-2-yl)-N,N'-diphenylfluorene-2,7-diamine (PFFA), N,N,N',N'-tetrakis(9,9-dimethylfluorene-2-yl)-[1,1'-biphenyl]-4,4'-diamine (FFD), (NDA) PP, 4,4'-bis-[N,N'-(3-tolyl)amino]-3,3'-dimethylbiphenyl (HMTPD). Of course, it is not limited thereto, and two or more kinds of these materials may be used in combination.

In addition, it is desirable that the hole transport layer lowers the barrier against an anode, or enhances electric conductivity, by containing an oxidizing agent in the hole transport material. A specific example of the oxidizing agent includes a Lewis acid compound such as ferric chloride, ammonium chloride, gallium chloride, indium chloride, antimony pentachloride, or an electron accepting compound such as trinitrofluorene. Of course, it is not limited to these materials, and two or more kinds of these materials may be used in combination.

"A luminescence layer" referred to here indicates a layer where injected holes and electrons recombine to emit light at inherent wavelength of a material. There are two cases: a case where a host material itself which forms the luminescence layer, emits light, and a case where a trace amount of dopant material added to a host emits light. As a specific host material, it is desirable to be a distyrylarylene derivative (DPVBi), a silole derivative having a benzene ring in a skeltone (2PSP), an oxadiazole derivative having a triphenylamine structure in both ends (EM2), a perinone derivative having a phenanthrene group (P1), an oligo thiophene derivative having a triphenylamine structure in both ends (BMA-3T), a perylene derivative (tBu-PTC), tris(8-quinolinol)aluminium, a polyparaphenylene-vinylene derivative, a polythiophene derivative, a polyparaphenylene derivative, a polysilane derivative, a polyacetylene derivative. In addition, of course, it is not limited to these materials, and two or more kinds of these materials may be used in combination.

On the other hand, as a specific dopant material, it is desirable to be quinacridone, coumarin 6, Nile red, rubrene, 4-(dicyanomethylene)-2-methyl-6-(para-dimethylaminostyryl)-4H-pyran (DCM), a dicarbazole derivative, a porphyrin-platinum complex (PtOEP), an iridium complex (Ir(ppy)3). In addition, of course, it is not limited to these materials, and two or more kinds of these materials may be used in combination.

"An electron transport layer" referred to here has a role of transporting and injecting electrons into the luminescence layer. Therefore, it is desirable to be made of an electron transport material having high electron mobility. Specifically, tris(8-quinolinol)aluminum, an oxadiazole derivative, a silole derivative, a zinc-benzothiazole complex, basocuproin (BCP) is desirable. In addition, of course, it is not limited to these materials, and two or more kinds of these materials may be used in combination.

In addition, it is desirable that the electron transport layer lowers the barrier at the cathode, or enhances electric conductivity, by containing a reducing agent in the electron transport material. A specific example of the reducing agent includes an alkali metal, an alkaline earth metal, an alkali metal oxide, an alkaline earth metal oxide, a rare earth oxide, an alkali metal halide, an alkaline earth metal halide, a rare earth halide, a complex formed by an alkali metal and an aromatic compound. In particular, the preferable alkali metal includes Cs, Li, Na and K. In addition, of course, it is not limited to these materials, and two or more kinds of these materials may be used in combination.

"An electron injection layer" referred to here is used to enhance electron injection efficiency from a cathode to the electron transport layer. Specifically, a desirable one includes lithium fluoride, magnesium fluoride, calcium fluoride, strontium fluoride, barium fluoride, magnesium oxide, and aluminum oxide. In addition, of course, it is not limited to these materials, and two or more kinds of these materials may be used in combination.

"A cathode" referred to here is desirably a conducting film having small work function for enhancing the electron injection efficiency. Specifically, it includes a magnesium-silver alloy, an aluminum-lithium alloy, an aluminum-calcium alloy, an aluminum-magnesium alloy and metal calcium, however, it is not limited to these materials.

In addition, by applying the electron injection layer, use of a material having low work function which is a condition of a cathode becomes not required, and use of a general metal material is possible. Specifically, it is desirable to be a metal such as aluminum, indium, molybdenum, nickel, or an alloy using these metals, or polysilicon, amorphous silicon.

"A protecting layer" referred to here is formed on the upper part electrode to prevent entering of $H_2O$ or $O_2$ in atmosphere into the upper part electrode or an organic layer thereunder.

Specifically, inorganic materials such as $SiO_2$, SiNx, $Al_2O_3$, or an organic material such as polychloroprene, polyethylene terephthalate, polyoxymethylene, polyvinyl chloride, polyvinylidene fluoride, cyanoethyl pullulan, polymethyl methacrylate, polysulfone, polycarbonate, polyimide are included, but it is not limited to these materials.

It is desirable that an organic electroluminescence display device relevant to the present invention uses the above organic luminescence element as a pixel. In addition, it is desirable that an organic electroluminescence display device relevant to the present invention uses a color conversion layer.

"An organic electroluminescence display device" referred to here indicates a display device using an organic luminescence element as a pixel. The organic electroluminescence display device is classified into a simple matrix organic electroluminescence display device and an active matrix organic electroluminescence display device.

The simple matrix organic electroluminescence display device is formed with an organic layer such as a hole transport layer, a luminescence layer, an electron transport layer, at a position where a plurality of anode lines and cathode lines are crossed, and each pixel is lighted only for a selected time in one frame period. The selected time is a time width in which one frame period is divided by the number of the anode lines.

In the active matrix organic electroluminescence display device, a driving element, composed of a switching element of 2 to 4 thin film transistors and a capacitance, is connected to an organic EL (electroluminescence) element composing each pixel, which makes possible lighting for all time of the one frame period. Therefore, it is not necessary to increase brightness, which makes it possible to elongate the life-time of the organic luminescence element.

"A pixel" referred to here is one arranged in plenty, vertically and horizontally at the screen of a display device, and a minimal unit to display a character or a graphic in a display region. In addition, "a sub-pixel" is one, in a display device for performing color display, and a minimal unit for further dividing a pixel. As a color image, it is general that a structure is composed of sub-pixels of three colors of green, red and blue. In addition, "a display region" is a region where an image is displayed, in a display device.

"A light conversion layer" referred to here indicates a layer for converting luminescence light in an organic luminescence element, which is a pixel or a sub-pixel, to light of other color. Constitution of the light conversion layer is classified into a structure laminated on an organic luminescence element, and a structure laminated on an opposed substrate.

Referring to the structure laminated on an organic luminescence element, the color conversion layer is formed, directly or via a protecting layer, on the organic luminescence element, which is a pixel or a sub-pixel part. A black matrix is formed between pixels or sub-pixels, to prevent luminescence of the color conversion layer, and luminescence from adjacent pixels or sub-pixels. Formation order of the black matrix and the color conversion layer is not especially specified. The protecting layer is formed thereon, as occasion demands.

Referring to the structure where the color conversion layer is formed at the opposed substrate, the black matrix, the color conversion layer and the protecting layer are formed on the opposed substrate, and adhered with an organic EL substrate. In this case, adhesion is adjusted so that a predetermined color conversion layer is positioned on a pixel or a sub-pixel.

As the color conversion layer, broadly, a color filter layer and a color conversion layer are included. The color filter layer indicates one that emits a part of incident light spectra. A material of the color filter contains a coloring matter and a binder resin. As the coloring matter, a red coloring matter, a blue coloring matter, a green coloring matter or the like are included.

As a specific example of the red coloring matter, a perylene-type pigment, a lake pigment, an azo-type pigment, a quinacridone-type pigment, an anthracene-type pigment, an isoindolin-type pigment, an isoindolinone-type pigment or the like is desirable. In addition, of course, it is not limited to these materials, and two or more kinds of these materials may be used in combination.

As a specific example of the blue coloring matter, a copper phthalocyanine-type pigment, an indanthrone-type pigment, an indophenol-type pigment, a cyanine-type pigment, a dioxazine-type pigment or the like is desirable. In addition, of course, it is not limited to these materials, and two or more kinds of these materials may be used in combination.

As a specific example of the green coloring matter, a coumarin-type pigment or the like is desirable.

As the binder resin, a transparent material having light transmittance at visible light region of equal to or higher than 50% is desirable. Specifically, polymethyl methacrylate, polyacrylate, polycarbonate, polyvinylalcohol, polyvinylpyrrolidone, hydroxyethylcellulose, carboxyethylcellulose or the like is included. In addition, of course, it is not limited to these materials, and two or more kinds of these materials may be used in combination.

A method of formation of the color filter includes a dyeing method, a pigment dispersion method, a printing method, or an electrodeposition method, but it is not especially limited thereto.

"The color conversion layer" referred to here is composed of a color conversion fluorescence layer, which emits a fluorescence light excited by incident light, and a compensating color filter layer for compensating emission spectra.

"The color conversion fluorescence layer" contains a fluorescence coloring matter and a binder resin. As the fluorescence coloring matter, a red fluorescence coloring matter, a green fluorescence coloring matter or the like are included.

As a specific example of the red fluorescence coloring matter, a cyanine-type coloring matter such as 4-dicyanomethylene-2-methyl-6-(p-dimethylaminostyryl)-4H-pyran, a pyridine-type coloring matter such as 1-ethyl-2-[4-(p-dimethylaminophenyl)-1,3-butadienyl]-pyridinium-perchlorate, a rhodamine-type coloring matter such as rhodamine B, rhodamine 6G, or an oxazine-type coloring matter or the like is included. In addition, of course, it is not limited to these materials, and two or more kinds of these materials may be used in combination.

As a specific example of the green fluorescence coloring matter, a coumarin coloring matter such as 2,3,5,6-1H,4H-tetrahydro-8-trifluoromethylquinolizino[9,9a,1-gh]coumarin, 3-(2'-benzothiazolyl)-7-diethylaminocoumarin, 3-(2'-benzimidazolyl)-7-N,N-diethylaminocoumarin, a coumarin coloring matter-type dye such as basic yellow, solvent yellow, or the like are included. In addition, of course, it is not limited to these materials, and two or more kinds of these materials may be used in combination.

Embodiment 1

Explanation will be given on Embodiment 1 of an organic electroluminescence display device relevant to the present invention, with reference to drawings. FIG. 1 and FIG. 2 are plan views of pixels in an organic electroluminescence display device, FIG. 3A is a cross-sectional view along the A-A' line of FIG. 1, FIG. 3B is a cross-sectional view along the B-B' line of FIG. 1, and FIG. 4 is a cross-sectional view along the C-C' line of FIG. 1 and FIG. 2.

Figure 3A:
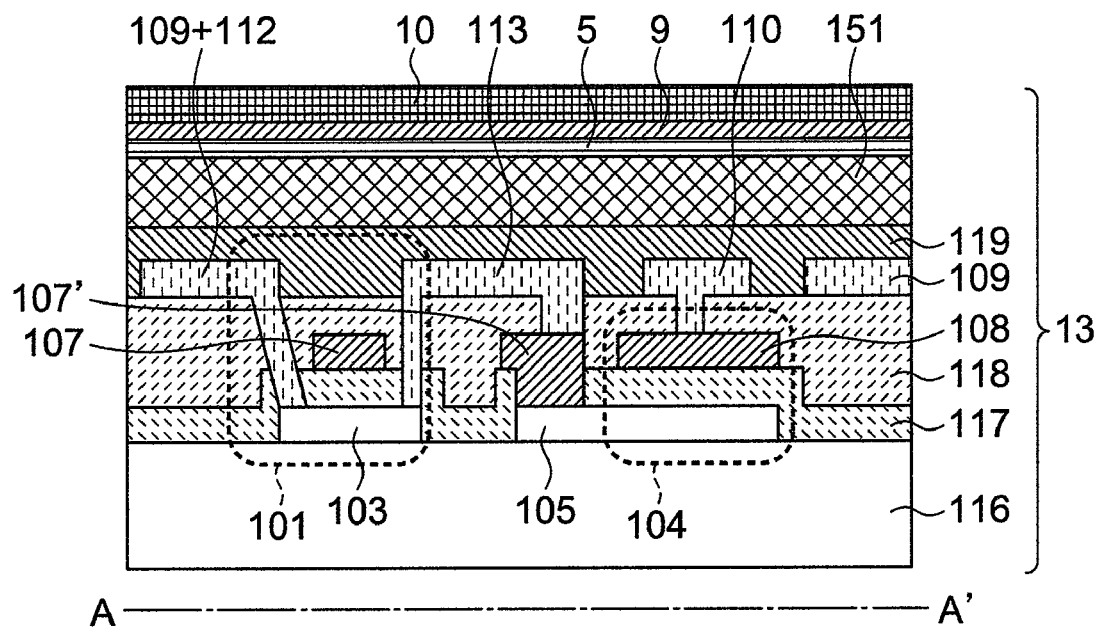
FIG. 3A is a cross-sectional view along the A-A' line of FIG. 1 (Embodiment 1).
Figure 3B:
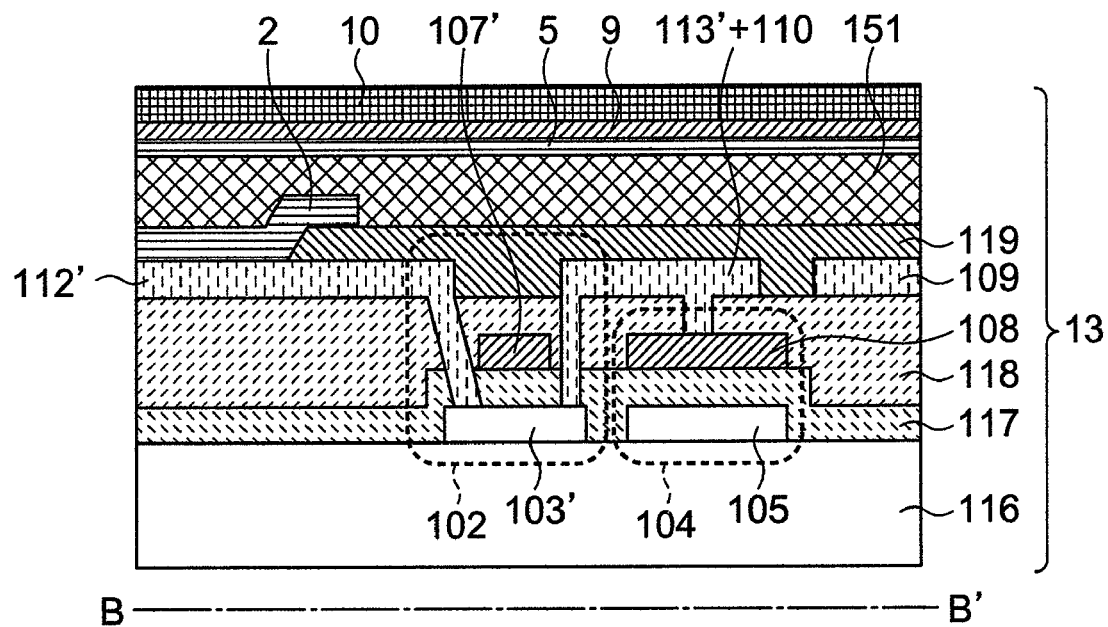
FIG. 3B is a cross-sectional view along the B-B' line of FIG. 1 (Embodiment 1).

In FIG. 1, on a glass substrate 116 shown in FIGS. 3A and 3B, there are arranged a plurality of scanning lines 106 in a constant interval, as well as signal lines 109 for transmitting image information, in a constant interval in a direction orthogonal to each scanning line. That is, each scanning line and each signal line are arranged in a lattice-shape, and a region surrounded by each scanning line and each signal line is a display region of one pixel portion or one sub-pixel portion. Further, on the glass substrate 116, a plurality of first current supply lines 110 connected to a power source, are arranged in parallel to the signal lines 109. Each scanning line 106, the signal line 109 and the first current supply line 110 are formed on the glass substrate 116, as a wiring belonging to a wiring layer, via an interlayer insulating film.

At the upper part side of this wiring layer, there are arranged a plurality of organic luminescence elements composing pixels each of which is a minimal unit of a color image. Each organic luminescence element is composed, as a sub-pixel, by being provided with an organic layer including a hole transport layer 5, each of color luminescence layers 6 to 8, and an electron transport layer 9, shown in FIG. 4, and lower part electrodes 2 to 4, and an upper part electrode 10, which sandwich this organic layer. The lower part electrodes 2 to 4 of the organic luminescence element belonging to each pixel are connected to the first current supply line 110 via a transistor as a driving element, and the upper part electrode 10 of the organic luminescence element belonging to each pixel is connected to an auxiliary wiring, which is connected to a power source.

Further, on the glass substrate 116, a driving layer for driving the organic layer of each pixel is formed. This driving layer is composed by being provided with a first transistor 101 and a second transistor 102 and a capacitance 104 as the driving elements. A gate electrode 107 of the first transistor 101 is connected to the scanning line 106, and a source electrode 112 is connected to the signal line 109, and a drain electrode 113 is connected to a gate electrode 107' of the second transistor and a lower part electrode 105 of the capacitance 104. A drain electrode 113' of the second transistor 102 is connected to an upper part electrode 108 of the capacitance 104 and the first current supply line 110, and a source electrode 112' is connected to the lower part electrodes 2 to 4.

Then, explanation will be given on a method of manufacturing an organic electroluminescence display device having the above constitution. First of all, on the glass substrate 116 in FIG. 3, there is formed an amorphous silicon (a-Si) film with a film thickness of 50 nm by using a low pressure chemical vapor deposition method (LPCVD method). A raw material is $Si_2H_6$, and substrate temperature is set at 450° C. Then, by using a XeCl excimer laser, the whole film surface is subjected to laser annealing treatment. This laser annealing treatment is performed by dividing into two steps, the irradiation energy in the first time and the second time were 188 mJ/cm$^2$ and 290 mJ/cm$^2$, respectively. In this way, amorphous silicon was crystallized, resulting in polycrystalline silicon (p-Si). Then, the polycrystalline silicon is subjected to patterning by dry etching using $CF_4$, to form an activated layer 103 of the first transistor 101 shown in FIG. 3A, and an activated layer 103' of the second transistor 102 and the lower part electrode 105 of the capacitance 104 shown in FIG. 3B.

Then, as a gate insulating layer 117, a $SiO_2$ film with a film thickness of 100 nm is formed. This $SiO_2$ film was formed using tetraethoxysilane (TEOS) as a raw material by a plasma enhanced chemical vapor deposition method (PECVD method).

Then, as the gate electrodes 107 and 107', a TiW film with a film thickness of 50 nm was prepared by a sputtering method, and subjected to patterning. In this procedure, the scanning line 106 and the upper part electrode 108 on the capacitance 104 were also subjected to patterning.

Then, by using an ion implantation method, P ions having a density of 4×10$^{15}$ ions/cm$^2$ and an energy of 80 keV are implanted into a patterned polycrystalline silicon layer from the upper part of the gate insulating layer 117. In this case, the P ions are not implanted into a region having the gate electrodes 107 and 107' at the upper part, resulting in activated regions 103 and 103'.

Then, the glass substrate 116 is heated at 300° C. for 3 hours under inert $N_2$ atmosphere, so that doping is performed effectively by activating an ion. A region of polycrystalline silicon (p-Si) implanted with the ions results in a surface resistance value of 2 kΩ/□. A silicon nitride (SiNx) film was formed thereon as a first interlayer insulating film 118. Thickness of this film is 200 nm.

Then, a contact hole (not shown) is formed at the gate insulating layer 117 and the first interlayer insulating film 118, at the upper part of the both ends of the activated layers 103 and 103'. Further, as shown in FIG. 3A, a contact hole (not shown) is formed at the first interlayer insulating film 118, present at the upper part of the gate electrode 107' of the second transistor 102 and the upper part of the upper part electrode 108 of the capacitance 104.

An Al film with a film thickness of 500 nm is formed thereon by a sputtering method. The signal line 109 and the first current supply line 110 are formed by a photolithography process. In addition, the source electrode 112 and the drain electrode 113 of the first transistor 101, and the source electrode 112' and the drain electrode 113' of the second transistor 102 are formed.

In addition, the lower part electrode 105 of the capacitance 104, and the drain electrode 113 of the first transistor 101 are connected via the gate electrode 107', and the source electrode 112 of the first transistor 101 and the signal line 109 are connected. In addition, the drain electrode 113 of the first transistor 101 is connected to the gate electrode 107' of the second transistor 102, and the drain electrode 113' of the second transistor 102 is connected to the first current supply line 110. In addition, the upper part electrode 108 of the capacitance 104 is connected to the first current supply line 110.

Then, an SiNx film is formed as a second interlayer insulating film 119. Thickness of this film is 500 nm. A contact hole (not shown) is formed at the upper part of the drain electrode 112' of the second transistor 102, and a Cr film with a thickness of 150 nm is formed thereon by using a sputtering method, and the lower part electrode 2 of a pixel is formed by using a photolithography method.

Then, a protecting acryl film is formed as a third interlayer insulating film 151. In this case, film-formation was performed by a spin-coating method under a coating condition of 1000 rpm/30 seconds, and the film was subjected to pre-baking under a condition of 90° C./2 minutes by placing a glass substrate 116 on a hot plate.

This third interlayer insulating film 151 had a film thickness of 2 μm, and was covered from the end of the lower part electrodes 2 to 4 of a pixel to an inside part by 3 μm therefrom. It also covered a contact hole part, which connected the drain electrode 112' and the lower part electrodes 2 to 4 of a pixel. This is for preventing a short-circuit between the lower part electrodes 2 to 4 of a pixel and the upper part electrode 10.

Then, explanation will be given on a structure of an organic luminescence element to be a pixel, with reference to FIG. 4. The glass substrate 116 formed with up to the lower part electrodes 2 to 4, is subjected to ultrasonic washing with pure water, spin drying, and then drying in an oven at 120° C. for 30 minutes.

Then, a film of 4,4'-bis[N-(1-naphthyl)-N-phenylamino] biphenyl (hereafter referred to as "α-NPD") with a film thickness of 50 nm is formed on the lower part electrode 2, by a vacuum vapor deposition method. The vapor deposition rate of α-NPD was set to be 0.15±0.01 nm/sec. This α-NPD film was formed at the whole surface of a luminescence area to function as the hole transport layer 5.

Then, explanation will be given on formation of a luminescence layer at each sub-pixel. The lower part electrode 2 functions as a sub-pixel of red luminescence color (hereafter referred to as "R sub-pixel"). A film co-deposited of tris(8-quinolinol)aluminum (hereafter referred to as "Alq3") and coumarin, with a film thickness of 30 nm, is formed on the hole transport layer 5, by a vacuum vapor deposition method.

The vapor deposition rates of this Alq3 and coumarin were set to be 0.20±0.01 nm/sec, and 0.01±0.005 nm/sec, respectively. The above co-deposited film functions as an R luminescence layer 6. In addition, coumarin in the R luminescence layer 6 functions as a dopant determining the luminescence color. The co-deposited film of Alq3 and coumarin is subjected to patterning, by using a precise mask having an opening pattern with the same size as the sub-pixel.

Then, explanation will be given on a sub-pixel of green luminescence color (hereafter referred to as "a G sub-pixel") formed on the lower part electrode 3. A film co-deposited of Alq3 and quinacridone, with a film thickness of 30 nm, is formed on the hole transport layer 5 by a vacuum vapor deposition method.

The vapor deposition rates of this Alq3 and quinacridone were set to be 0.20±0.01 nm/sec, and 0.01±0.005 nm/sec, respectively. The above co-deposited film functions as a G luminescence layer 7. In addition, quinacridone in the G luminescence layer 7 functions as a dopant determining luminescence color. The co-deposited film of Alq3 and quinacridone is subjected to patterning, by using a precise mask having an opening pattern with the same size as the sub-pixel.

Then, explanation will be given on a sub-pixel of blue luminescence color (hereafter referred to as "a B sub-pixel") formed on the lower part electrode 4. A film co-deposited of BAlq3 and a styrylamine compound, 1,4-bis[N-(3-methylphenyl)-N'-phenyl-4-aminophenylvinylene]2,5-dimethoxybenzene, (hereafter referred to as "DSA"), with a film thickness of 30 nm, is formed on the hole transport layer 5, by a vacuum vapor deposition method.

The vapor deposition rates of this BAlq3 and DSA were set to be 0.20±0.01 nm/sec, and 0.01±0.005 nm/sec, respectively. The above co-deposited film functions as a B luminescence layer 8. In addition, DSA in the B luminescence layer 8 functions as a dopant determining luminescence color. The co-deposited film of BAlq3 and DSA is subjected to patterning, by using a precise mask having an opening pattern with the same size as the sub-pixel.

Then, a film of Alq3 with a film thickness of 30 nm is formed on each of the luminescence layers 6 to 8 by a vacuum vapor deposition method.

The vapor deposition rate of Alq3 was set to be 0.15±0.01 nm/sec. This Alq3 film is formed at the whole surface of a luminescence area, resulting in to function as the electron transport layer 9.

Then, a mixed film of Mg and Ag is formed as an electron injection layer on the electron transport layer 9. In this case, by using a two-component simultaneous vacuum vapor deposition method, the vapor deposition rates thereof were set to be 0.14±0.05 nm/sec, and 0.01±0.005 nm/sec, respectively, and a film with a film thickness of 10 nm was vapor deposited.

Then, an In—Zn—O film (hereafter referred to as "an IZO film") with a film thickness of 50 nm is formed by a sputtering method. This film functions as the upper part electrode 10, and is an amorphous oxide film. As a target in this case, a target having In/(In+Zn)=0.83 was used. The film-formation condition was set to be a vacuum degree of 0.2 Pa and a sputtering output power of 2 W/cm², with using a mixed gas of Ar and $O_2$ as atmosphere. The transmittance of a laminated film of Mg:Ag/In—Zn—O was 65%.

Then, an Al film with a film thickness of 100 nm is formed by a vapor deposition method. The Al vapor deposition film is formed by using a stripe-shape precise mask, and functions as the first auxiliary wirings 11 to 11''' shown in FIG. 2. These auxiliary wirings 11 to 11''' are arranged in parallel to a signal line, and are positioned between the R sub-pixel and the G sub-pixel, between the G sub-pixel and the B sub-pixel, and between the B sub-pixel and the R sub-pixel.

Then, an Al film with a film thickness of 100 nm is formed by a vapor deposition method. The Al vapor deposition film is formed by using a stripe-shape precise mask, and functions as the second auxiliary wirings 12 and 12' shown in FIG. 2. These auxiliary wirings 12 and 12' are arranged in parallel to a scanning line and are positioned between sub-pixels. As shown in FIG. 2, it is desirable that they are positioned on a region being not provided with the lower part electrodes 2 to 4.

The auxiliary wirings are arranged in a lattice-shape with the first auxiliary wirings 11 to 11''' and the second auxiliary wirings 12 and 12'.

In this way, a TFT substrate 13, formed with a driving layer and a plurality of organic luminescence elements, can be manufactured on the glass substrate 116.

Then, the TFT substrate 13 is transferred to a sealing room keeping high dew point, without exposing to atmosphere and by circulation of dry nitrogen gas.

Then, a glass substrate is introduced into the sealing room. This glass substrate becomes a sealing substrate 14. A photocurable resin was drawn (not shown) at the edge part of the sealing substrate made of a glass substrate, by using a seal dispenser apparatus.

This sealing substrate 14 and the TFT substrate 13 are laminated and adhered with pressure in the sealing room. A light shielding plate was placed at the outside of the sealing substrate 14, so as not to irradiate UV light at the whole part of a luminescence element, and the photocurable resin was subjected to curing by irradiating UV light from the sealing substrate 14 side.

As described above, explanation was given on a top-emission-type color organic electroluminescence display device and a method of manufacturing the same. The feature of this organic electroluminescence display device is to dispose the lattice-shape auxiliary wiring surrounding the sub-pixel on the upper part transparent electrode and to electrically connect it with the upper part transparent electrode. Because of this structure, voltage-drop due to the resistance of the upper part transparent electrode between at the circumference part and at the center part of a panel can be suppressed, and the difference of current value becomes 3% and the brightness variation in the panel can be suppressed.

Embodiment 2

Figure 5:
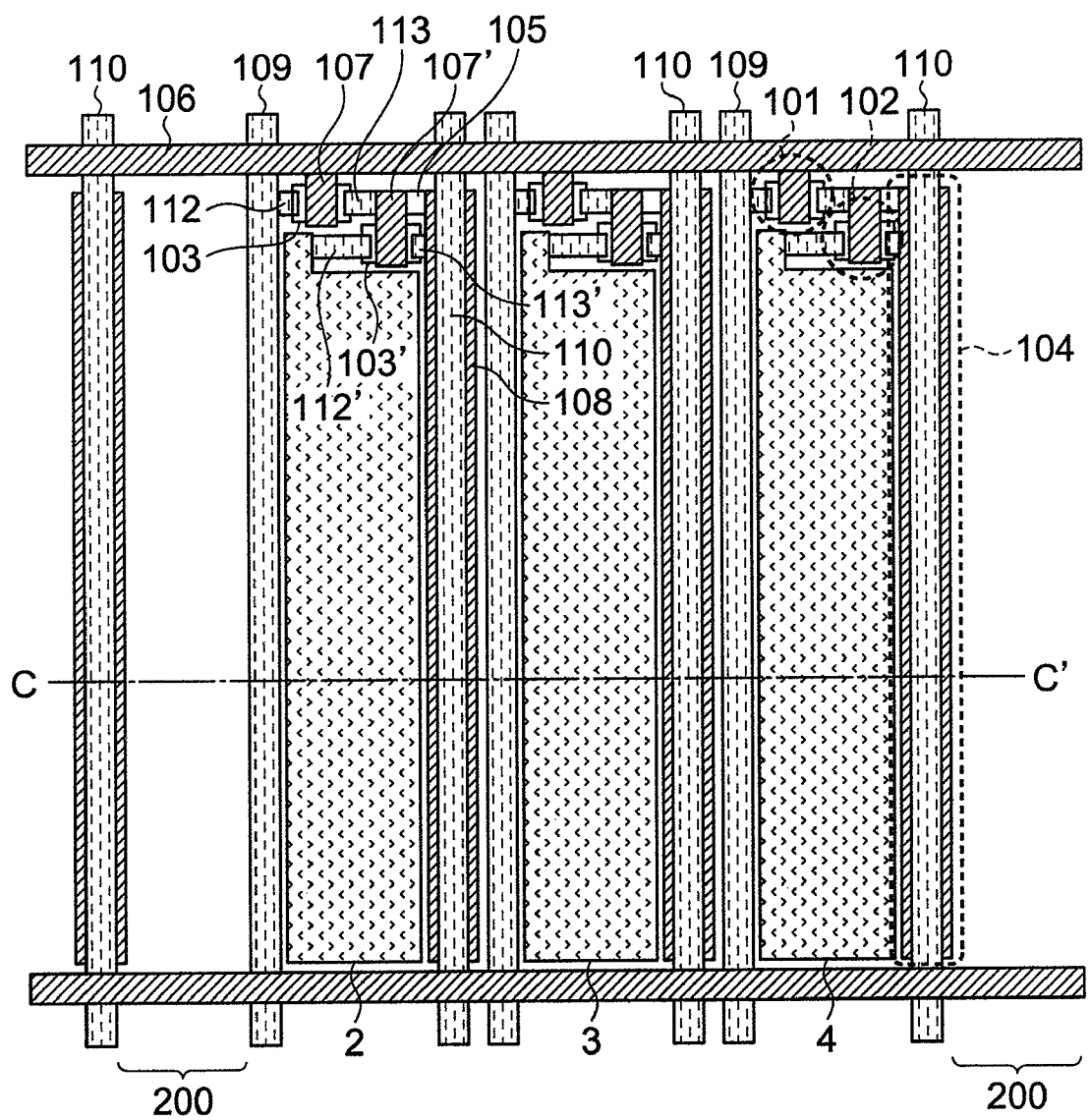
FIG. 5 is a plan view of a pixel in an organic electroluminescence display device (Embodiment 2).
Figure 6:
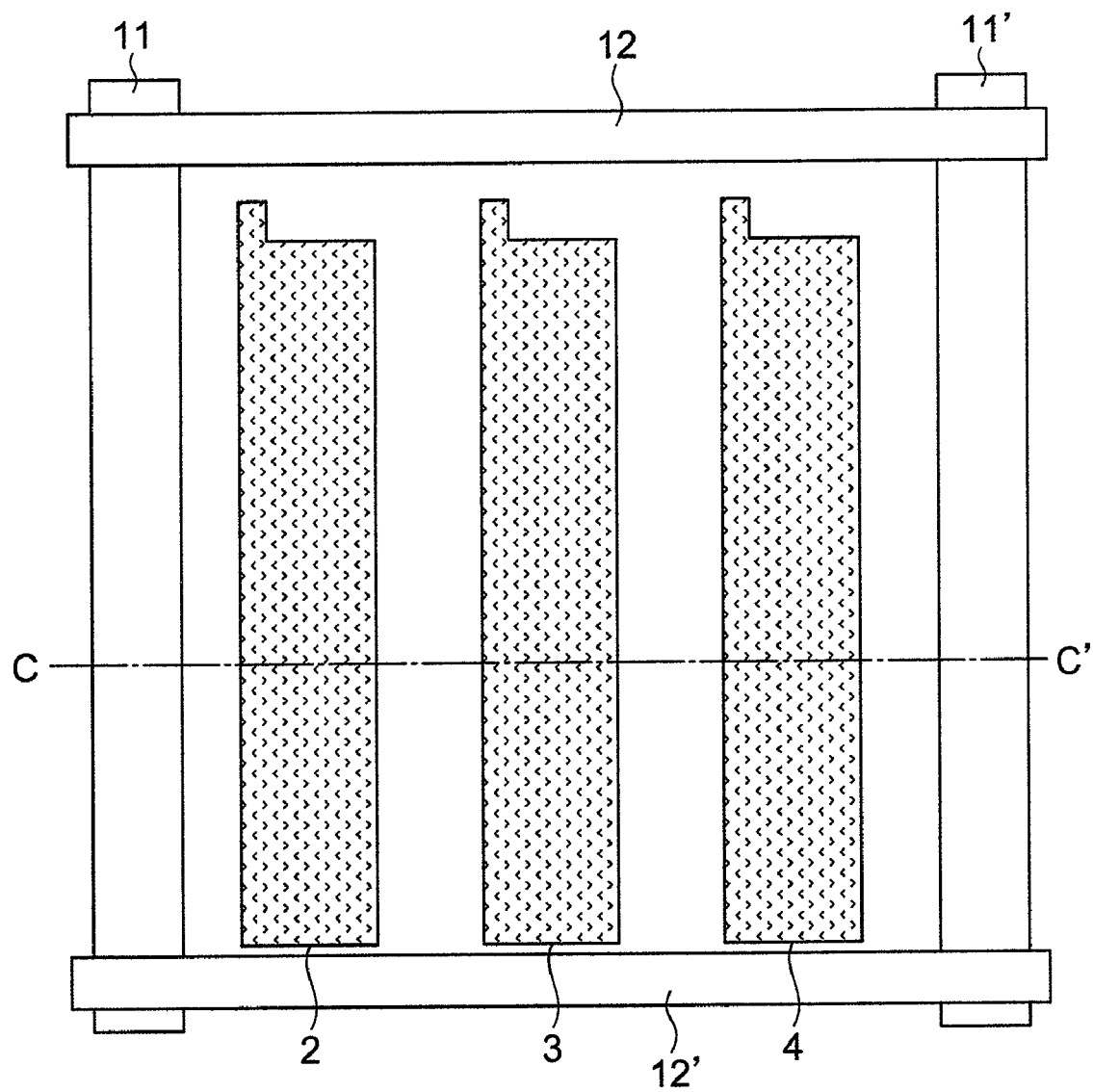
FIG. 6 is a plan view of a pixel in an organic electroluminescence display device (Embodiment 2).
Figure 7:
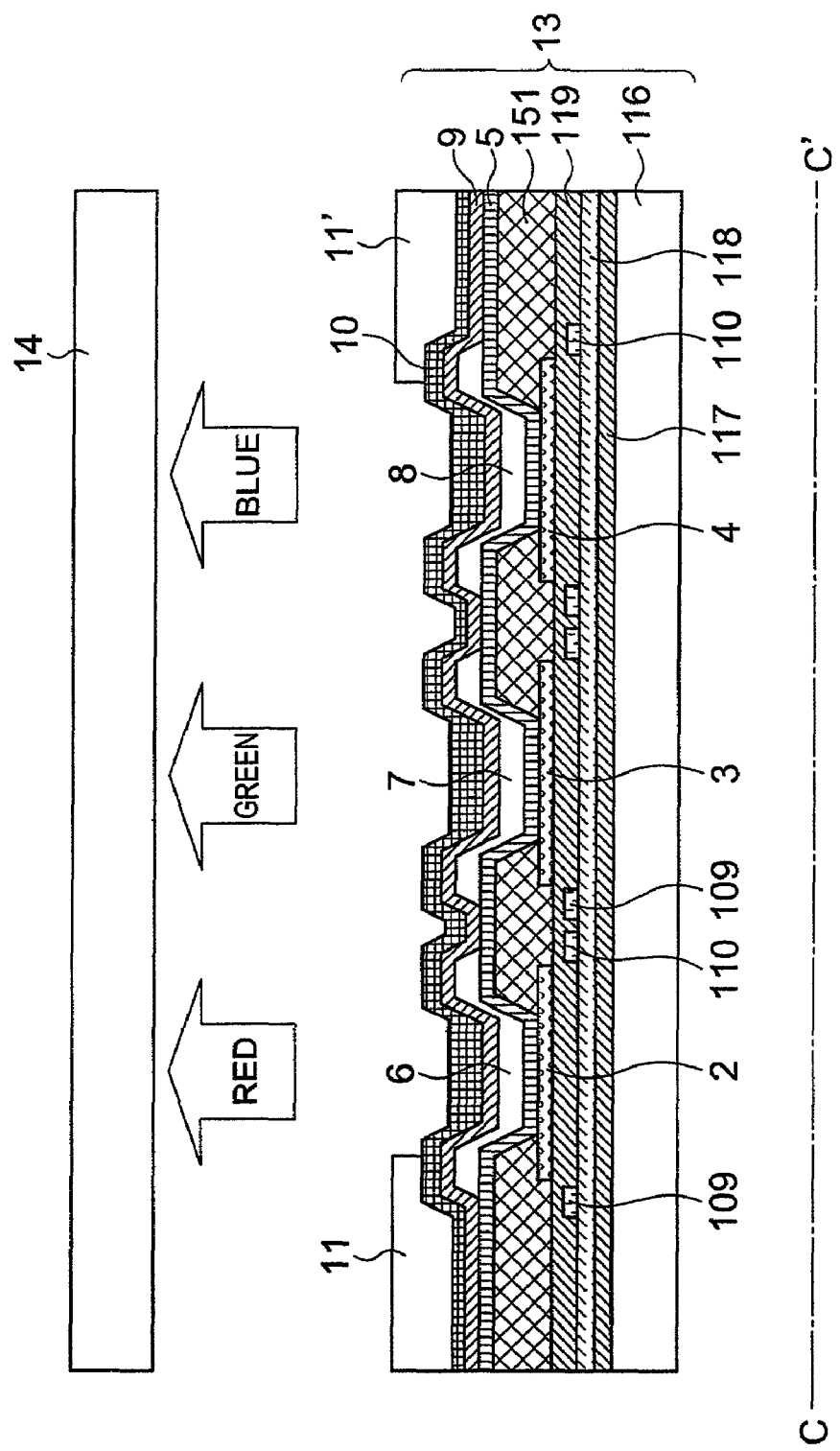
FIG. 7 is a cross-sectional view along the C-C' line of FIG. 5 and FIG. 6 (Embodiment 2).

Explanation will be given on Embodiment 2 of an organic electroluminescence display device relevant to the present invention, with reference to drawings. FIG. 5 and FIG. 6 are plan views of pixels of an organic electroluminescence display device, and FIG. 7 is a cross-sectional view along the C-C' line of FIG. 5 and FIG. 6. The present Embodiment is characterized in that width of an auxiliary wiring for an upper part transparent electrode formed by using a precise vapor deposition mask method is made wide, and wiring pitch is made wide. Owing to this constitution, formation by the precise mask becomes easy.

Specifically, a formation method of a first transistor 101, a second transistor 102, a capacitance 104, a signal line 109, a scanning line 106, a first current supply line 110, a first interlayer insulating layer 118, a second interlayer insulating layer 119 and lower part electrodes 2 to 4, on the glass substrate 116, is the same as in Embodiment 1.

As shown in FIG. 5, space 200 is provided between the signal line 109 of an R sub-pixel and the first current supply line 110 of a B sub-pixel 4.

Then, as shown in FIG. 7, a third interlayer insulating layer 151, a hole transport layer 5, an R luminescence layer 6, a G luminescence layer 7, a B luminescence layer 8, an electron transport layer 9 and an upper part electrode 10 are formed. Preparation conditions thereof are the same as in Embodiment 1.

In the space 200, first auxiliary wirings 11 and 11' extending in a direction parallel to the signal line 109 are formed (FIGS. 6 and 7). Second auxiliary wirings 12 and 12' extending in a direction parallel to the scanning line 106 are formed thereon (FIG. 6). In the present Embodiment, the width of the auxiliary wirings was made wider as compared with Embodiment 1. In addition, in order to form the auxiliary wirings at the space 200 between pixels, interval of the auxiliary wirings is also made wide. Therefore, width of an opening part of the precise shadow mask used for formation of the auxiliary wirings, and pitch of the opening part can be made wide, which enhances mass productivity.

A preparation method and preparation condition of overlapping of a TFT substrate 13 and a sealing substrate 14 are the same as in Embodiment 1.

In the present Embodiment, similarly to Embodiment 1, brightness variation in a panel was suppressed by a lattice-shape auxiliary wiring formed on the upper part transparent electrode. In addition, due to the arrangement of sub-pixel, it is capable of widening wiring width of the auxiliary wiring extending in a direction parallel to the signal line, which makes formation by a vapor deposition method using the precise mask easy.

Embodiment 3

Figure 8:
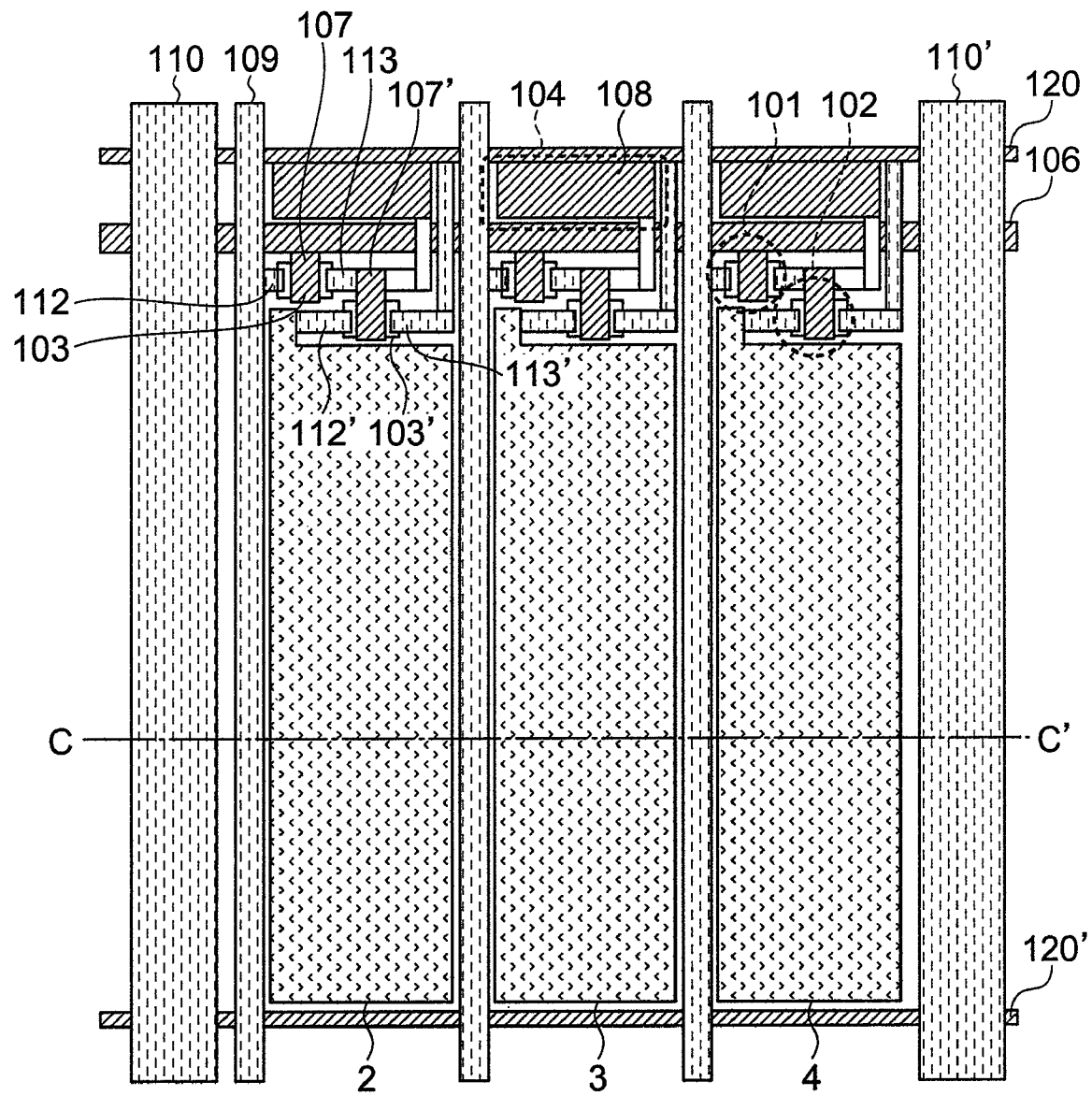
FIG. 8 is a plan view of a pixel in an organic electroluminescence display device (Embodiment 3).
Figure 9:
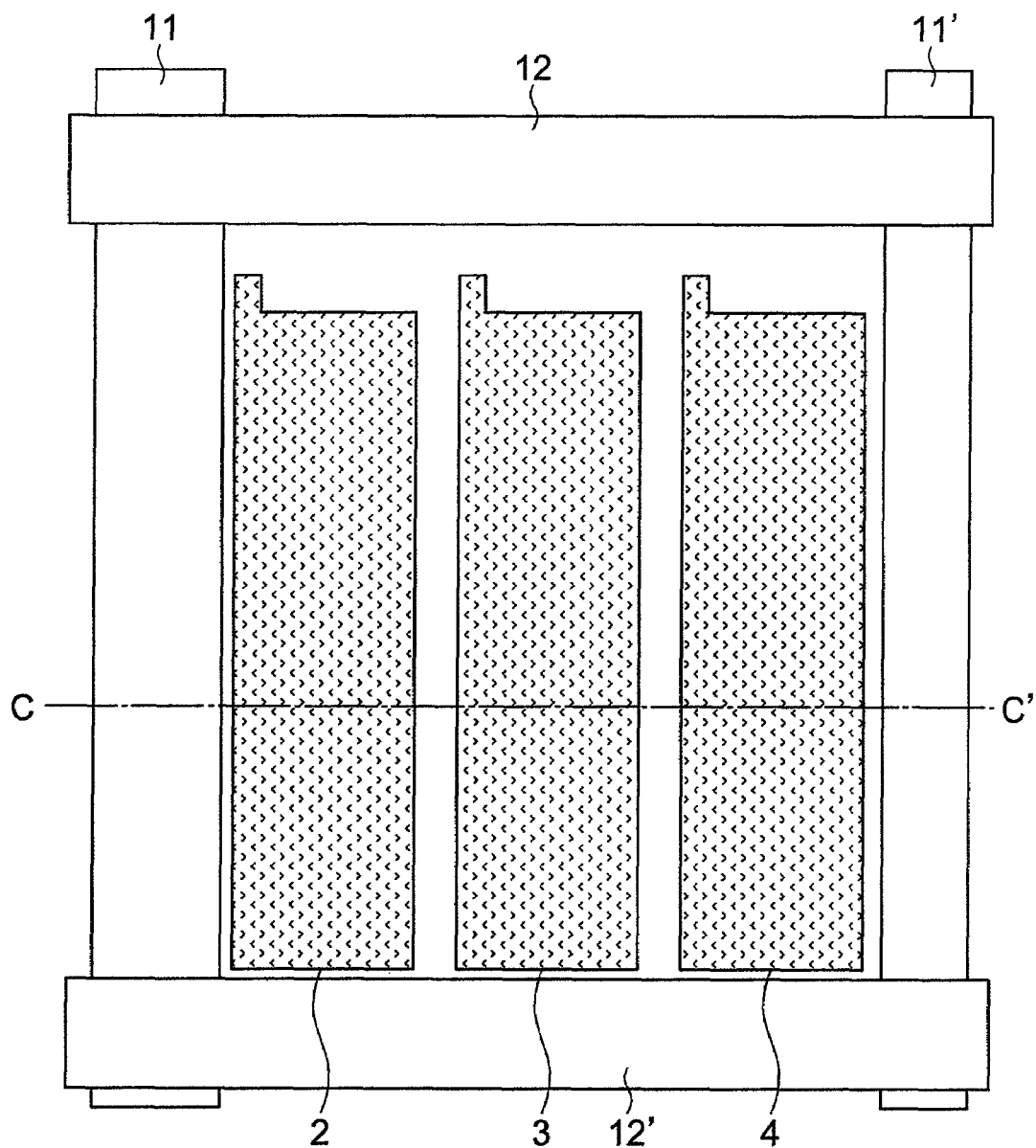
FIG. 9 is a plan view of a pixel in an organic electroluminescence display device (Embodiment 3).
Figure 10:
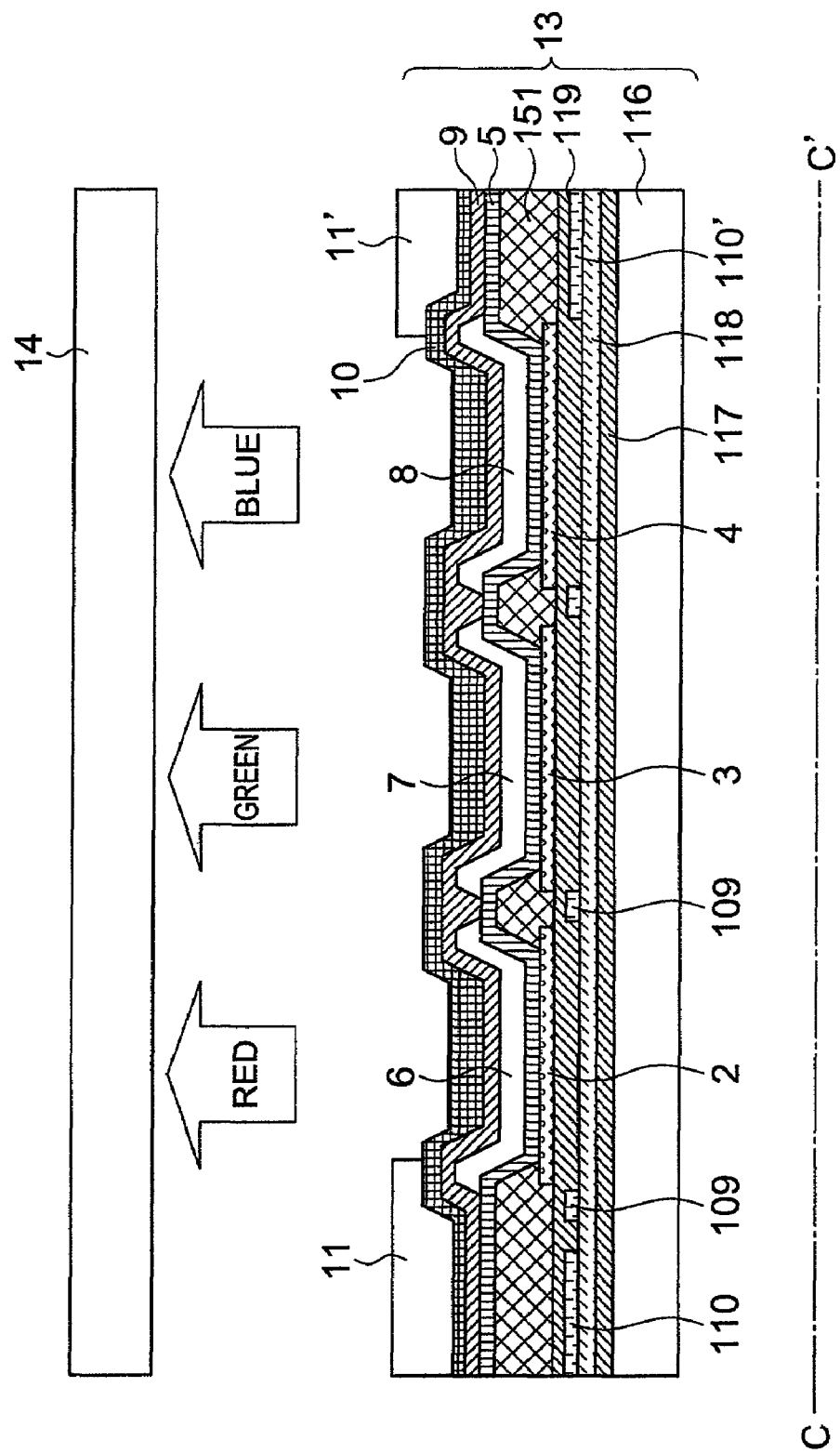
FIG. 10 is a cross-sectional view along the C-C' line of FIG. 8 and FIG. 9 (Embodiment 3).

Then, explanation will be given on Embodiment 3 of an organic electroluminescence display device relevant to the present invention, with reference to drawings. FIG. 8 and FIG. 9 are plan views of pixels in an organic electroluminescence display device, and FIG. 10 is a cross-sectional view along the C-C' line of FIG. 8 and FIG. 9. The present Embodiment has a constitution that a first current supply line 110 of an R sub-pixel, a G sub-pixel and a B sub-pixel in a pixel are made common.

Specifically, in FIG. 8, arrangement of a capacitance 104 is positioned at the upper side of a scanning line 106. In addition, at the left side of R sub-pixel 2, a signal line 109 for the R sub-pixel is positioned between the R sub-pixel 2 and the G sub-pixel 3, only a signal line 109 for the G sub-pixel is positioned, and between the G sub-pixel 3 and the B sub-pixel 4, also, a signal line 109 for the B sub-pixel 4 is positioned. In FIG. 8, the first current supply line 110 is positioned at the left side of the signal line 109 for the R sub-pixel.

In order to connect the first current supply line 110, and a drain electrode 113' of a second transistor 102 for the R sub-pixel, G sub-pixel and B sub-pixel, a second current supply line 120 is formed. The second current supply line 120 was formed by using the same TiW film as one formed with gate electrodes 107 and 107', the scanning line 106 and an upper part electrode 108 of the capacitance 104. In addition, the second current supply line 120 is connected to the upper part electrode 108 of the capacitance 104.

Other structures of a driving layer are the same as in Embodiment 2. In addition, preparation conditions of each layer are also the same as in Embodiment 2.

Then, as shown in FIG. 10, a third interlayer insulating layer 151, a hole transport layer 5, an R luminescence layer 6, a G luminescence layer 7, a B luminescence layer 8, an electron transport layer 9 and an upper part transparent electrode 10 are formed. Preparation conditions thereof are the same as in Embodiment 2.

Then, at the upper side of the first current supply line 110, as shown in FIG. 9, a first auxiliary wiring 11 is formed. Preparation method and preparation conditions are the same as in Embodiment 1. Then, at the upper side of a first transistor 101, a second transistor 102, the scanning line 106, the capacitance 104 and the second current supply line 120, as shown in FIG. 9, a second auxiliary wiring 12 is formed. Preparation method and preparation conditions are the same as in Embodiment 1.

Preparation method and preparation conditions of overlapping of a TFT substrate 13 and a sealing substrate 14 are the same as in Embodiment 1.

In the present Embodiment, similarly to Embodiment 1, brightness variation in a panel was suppressed by a lattice-shape auxiliary wiring formed on the upper part transparent electrode. In addition, by arrangement of the capacitance, it is capable of widening wiring width of the auxiliary wiring extending in a direction parallel to the signal line and a scanning line, which makes formation by a vapor deposition method using a precise mask easy. In addition, by arrangement of the first current supply line, in common to the R, G and B sub-pixels composing a pixel, area of a lower part electrode can be increased, and opening ratio can be widened.

Embodiment 4

Figure 11:
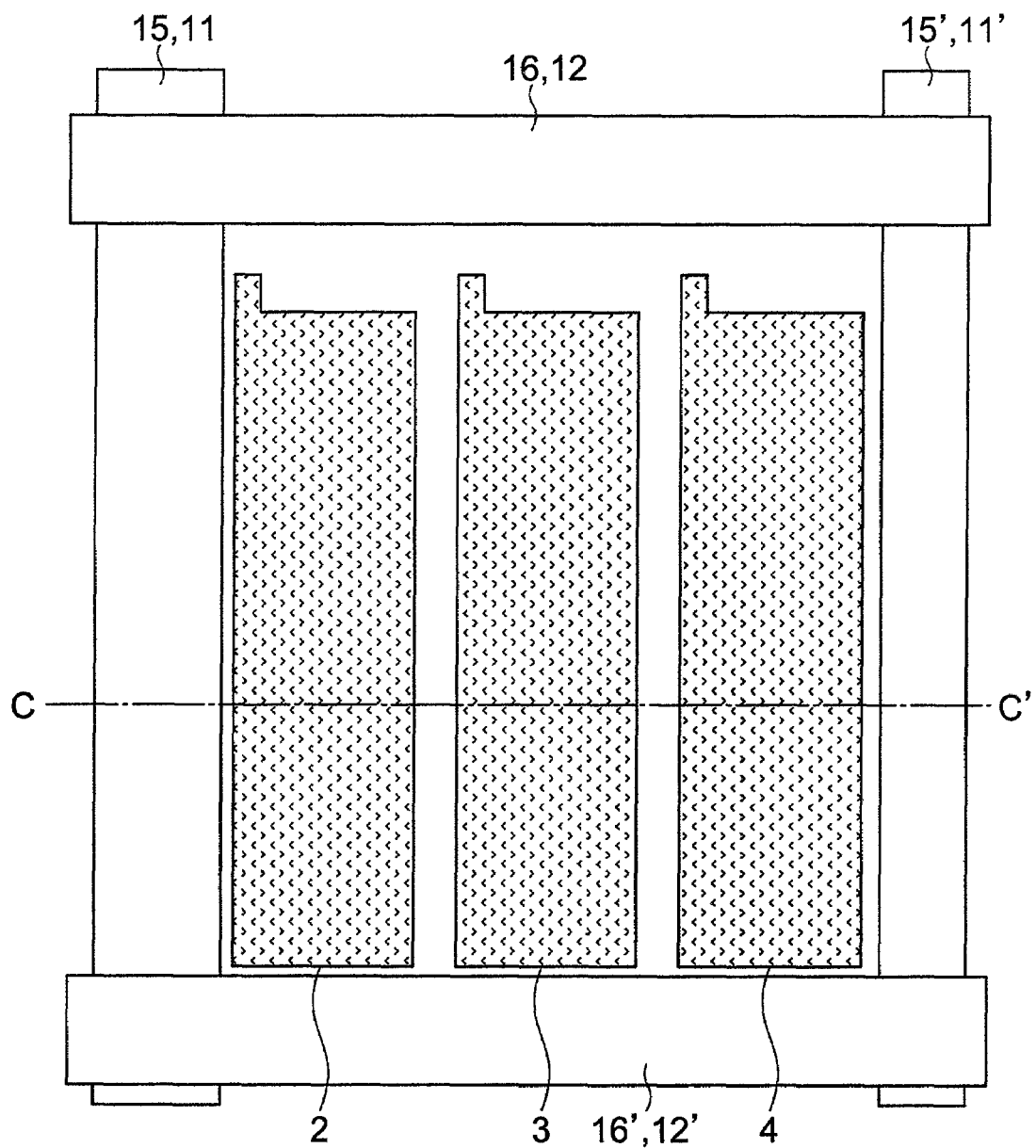
FIG. 11 is a plan view of a pixel in an organic electroluminescence display device (Embodiment 4).
Figure 12:
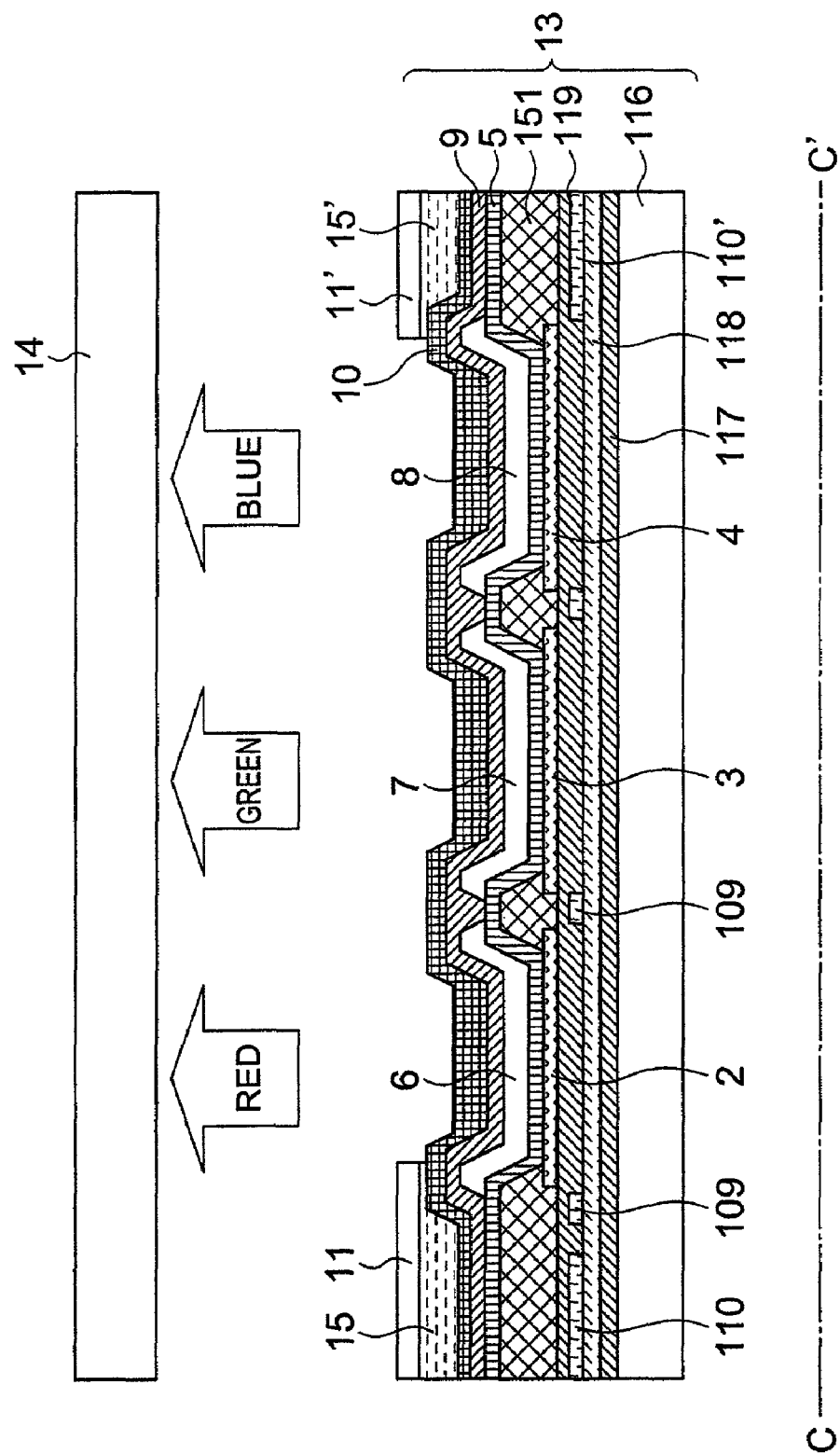
FIG. 12 is a cross-sectional view along the C-C' line of FIG. 11 (Embodiment 4).

Then, explanation will be given on Embodiment 4 of an organic electroluminescence display device relevant to the present invention, with reference to drawings. FIG. 11 is a plan view of pixels in an organic electroluminescence display device, and FIG. 12 is a cross-sectional view along the C-C' line of FIG. 11. The present Embodiment is characterized in that electrical connection layers 15 and 16 are formed between an upper part transparent electrode and an auxiliary wiring.

The formation method of a driving layer is the same as in Embodiment 3. In addition, as shown in FIG. 12, a third interlayer insulating layer 151, a hole transport layer 5, an R luminescence layer 6, a G luminescence layer 7, a B luminescence layer 8, an electron transport layer 9 and an upper part electrode 10 are formed. Preparation conditions thereof are the same as in Embodiment 3.

Then, by a vapor deposition method, a Cr film with a film thickness of 30 nm is formed on the upper part electrode 10. This Cr deposited film is formed by using a stripe-shape precise mask extending in a direction parallel to a signal line, and functions as a first electrical connection layer 15. Then, on the first electrical connection layer 15, a first auxiliary wiring 11 is formed by using the same precise mask. Preparation conditions are the same as in Embodiment 3.

Then, by a vapor deposition method, a Cr film with a film thickness of 30 nm is formed on the first auxiliary wiring 11 and the upper part electrode 10. This Cr deposited film is formed by using a stripe-shape precise mask extending in a direction parallel to a scanning line, and functions as a second electrical connection layer 16. Then, on the second electrical connection layer 16, a second auxiliary wiring 12 is formed by using the same precise mask. Preparation conditions are the same as in Embodiment 3.

A preparation method and preparation condition of overlapping of a TFT substrate 13 and a sealing substrate 14 are the same as in Embodiment 1.

In the present Embodiment, brightness variation in a panel was suppressed by a lattice-shape auxiliary wiring formed on the upper part transparent electrode. In addition, by arrangement of a sub-pixel, it is capable of widening wiring width of the auxiliary wiring extending in a direction parallel to the signal line and a scanning line, which makes formation by a vapor deposition method using a precise mask easy. In addition, by arrangement of a first current supply line, in common to the R, G and B sub-pixels composing a pixel, area of a lower part electrode can be increased, and opening ratio can be widened. In addition, by the formation of an electrical connection layer between the upper part transparent electrode and the auxiliary wiring, reliability of electrical connection was increased.

Embodiment 5

Figure 13:
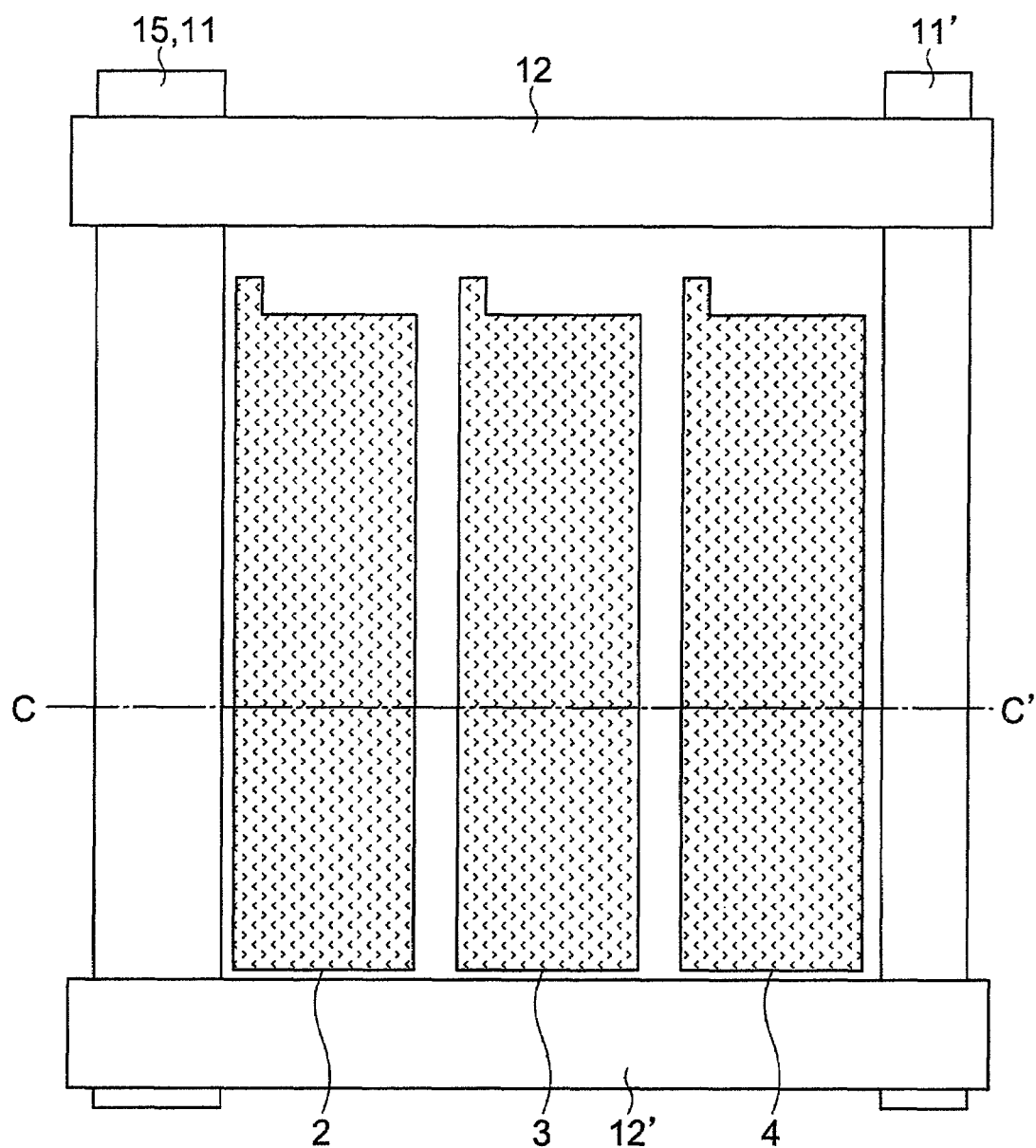
FIG. 13 is a plan view of a pixel in an organic electroluminescence display device (Embodiment 5).

Then, explanation will be given on Embodiment 5 of an organic electroluminescence display device relevant to the present invention, with reference to a drawing. FIG. 13 is a plan view of pixels of an organic electroluminescence display device, and a cross-sectional view along the C-C' line of FIG. 13 is the same as FIG. 12 of Embodiment 4. The present Embodiment is characterized in that an electrical connection layer 15 is formed between an auxiliary wiring formed in a lattice-shape and extending in one direction, and an upper part transparent electrode.

A formation method of a driving layer is the same as in Embodiment 3. In addition, a third interlayer insulating layer 151, a hole transport layer 5, an R luminescence layer 6, a G luminescence layer 7, a B luminescence layer 8, an electron transport layer 9 and an upper part electrode 10 are formed. Preparation conditions thereof are the same as in Embodiment 3.

Then, by a vapor deposition method, a Cr film with a film thickness of 30 nm is formed on the upper part electrode 10. This Cr deposited film is formed by using a stripe-shape precise mask extending in a direction parallel to a signal line, and functions as a first electrical connection layer 15. Then, on the first electrical connection layer 15, a first auxiliary wiring 11 is formed by using the same precise mask. Preparation conditions are the same as in Embodiment 3.

Then, a second auxiliary wiring 12 in parallel to a scanning line is formed. Preparation conditions are the same as in Embodiment 3.

A preparation method and preparation condition of overlapping of a TFT substrate 13 and a sealing substrate 14 are the same as in Embodiment 1.

In the present Embodiment, brightness variation in a panel was suppressed by a lattice-shape auxiliary wiring formed on the upper part transparent electrode. In addition, by arrangement of a sub-pixel, it is capable of widening wiring width of the auxiliary wiring extending in a direction parallel to the signal line, which makes formation by a vapor deposition method using a precise mask easy. In addition, by arrangement of a first current supply line, in common to the R, G and B sub-pixels composing a pixel, area of a lower part electrode can be increased, and opening ratio can be widened. In addition, by forming an electrical connection layer between the upper part transparent electrode and the first auxiliary wiring extending in parallel to the signal line, reliability of electrical connection was increased.

It should be noted that an electrical connection layer was not formed on a second current supply line extending in parallel to the scanning line, however, because electrical connection is secured in a region crossing with the first auxiliary wiring, the number of electrical connection layers can be reduced and process simplification can be attained.

Embodiment 6

Figure 14:
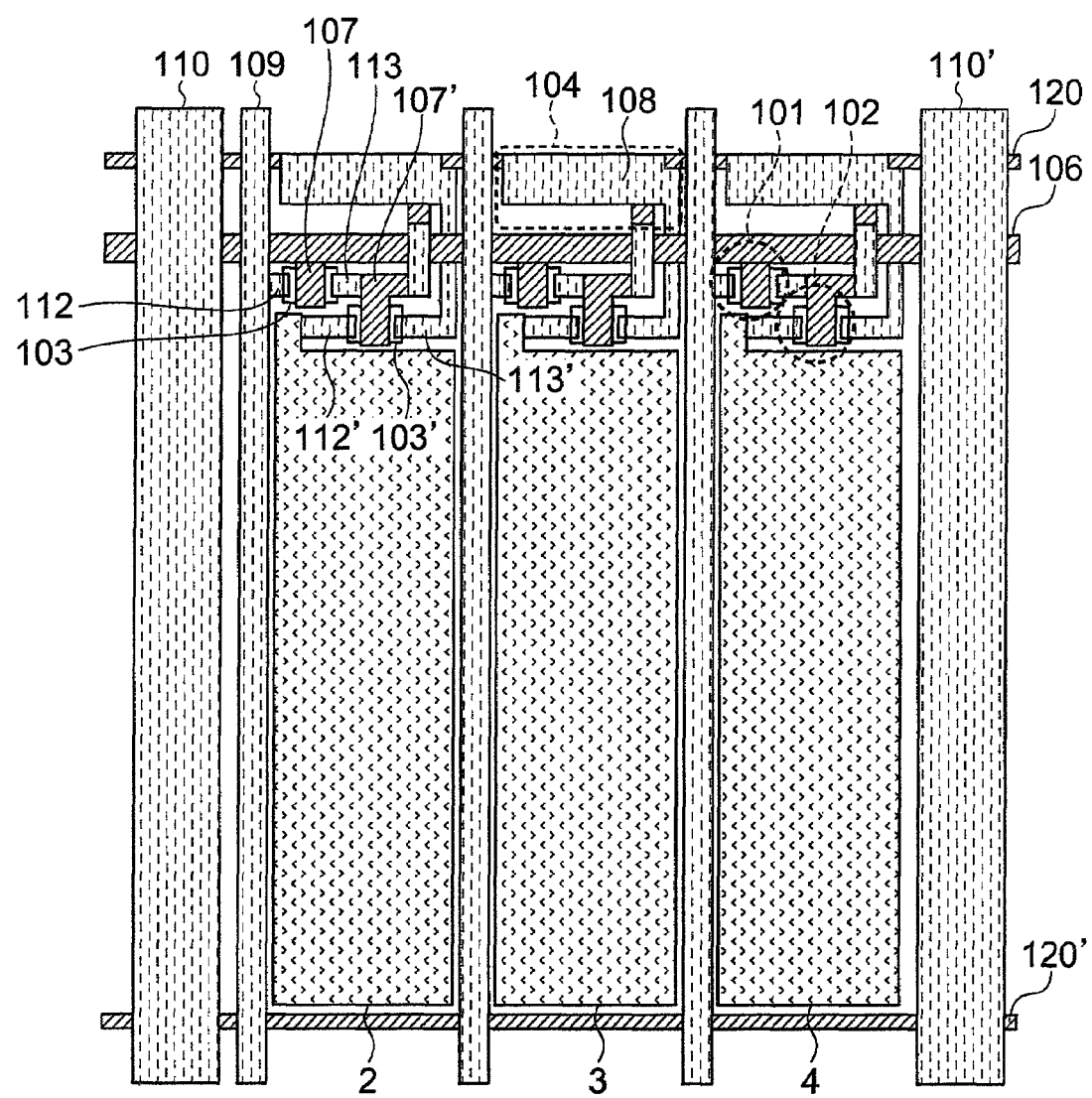
FIG. 14 is a plan view of a pixel in an organic electroluminescence display device (Embodiment 6).

Then, explanation will be given on Embodiment 6 of an organic electroluminescence display device relevant to the present invention, with reference to a drawing. FIG. 14 is a plan view of pixels of an organic electroluminescence display device. The present Embodiment is characterized in that a capacitance is formed in a pixel by using a metal layer of the same layer as the scanning line, a first interlayer insulating film and a metal layer of the same layer as the signal line.

Specifically, as explained above, a formation method of a first transistor 101, a second transistor 102, a capacitance 104, a signal line 109, a scanning line 106, a second current supply line 120, a first current supply line 110, a first interlayer insulating layer 118, a second interlayer insulating layer 119, and lower part electrodes 2 to 4, on the glass substrate 116, along with an organic luminescence element formed thereon and a sealing method thereof, are the same as in Embodiment 3.

A lower part electrode of the capacitance 104 is formed by a metal layer of the same layer as the scanning line 106. In order to connect this lower part electrode and a gate electrode 107' of the second transistor 102, a wiring using a metal layer of the same layer as the signal line 109 is used. It should be noted that the lower part electrode of the capacitance 104 is formed so as not to overlap with the second current supply line 120.

Then, an upper part electrode 108 of the capacitance 104 is formed by using a metal layer of the same layer as the signal line 109. It is in the same manner as in Embodiment 3 that the second current supply line 120 is used, in order to connect the first current supply line 110 and a drain electrode 113' of the second transistor 102.

In the present Embodiment, similarly to Embodiment 3, brightness variation in a panel was suppressed by a lattice-shape auxiliary wiring formed on the upper part transparent electrode, which makes formation by a vapor deposition method using the precise mask easy. In addition, because a metal layer of the same layer as the scanning line and the signal line was used in an electrode of a capacitance, the formation became easy.

Embodiment 7

Figure 15:
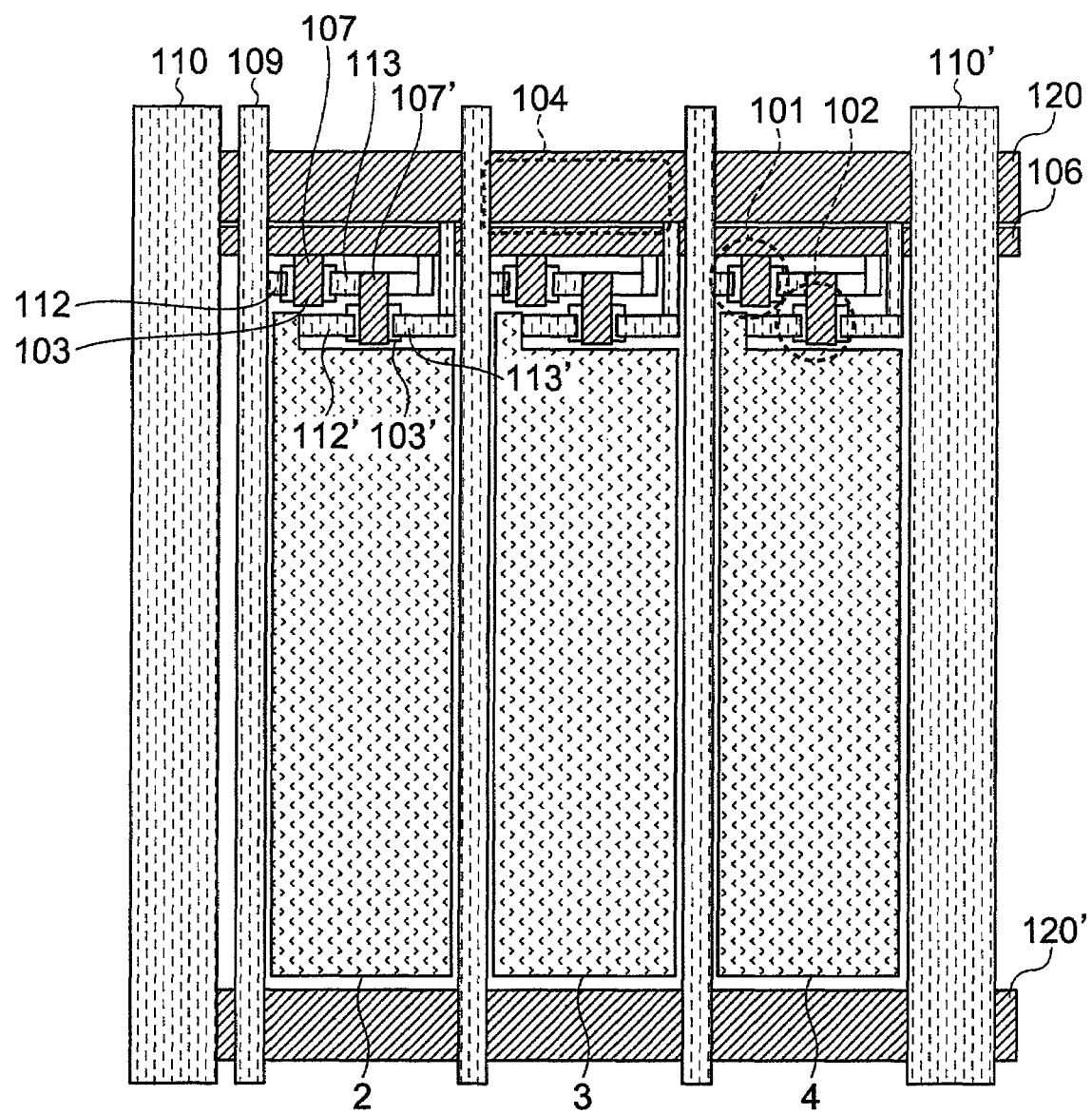
FIG. 15 is a plan view of a pixel in an organic electroluminescence display device (Embodiment 7).

Then, explanation will be given on Embodiment 7 of an organic electroluminescence display device relevant to the present invention, with reference to a drawing. FIG. 15 is a plan view of pixels of an organic electroluminescence display device. The present Embodiment is characterized in that a capacitance formed in a pixel, and a second current supply line in parallel to a scanning line are overlapped in a thickness direction.

Specifically, as explained above, on the glass substrate 116, a formation method of a first transistor 101, a second transistor 102, a capacitance 104, a signal line 109, a scanning line 106, a second current supply line 120, a first current supply line 110, a first interlayer insulating layer 118, a second interlayer insulating layer 119, and lower part electrodes 2 to 4, along with an organic luminescence element formed thereon and a sealing method thereof are the same as in Embodiment 3.

A formation method of a lower part electrode of the capacitance 104, by using an ionized polycrystalline silicon layer, is the same as in Embodiment 3.

In addition, an upper part electrode of the capacitance 104 and the second current supply line 120 are used in common. A method of connecting the first current supply line 110 and a drain electrode 113' of the second transistor 102, by using the second current supply line 120 commonly used with the upper part electrode of the capacitance 104, is the same as in Embodiment 3.

In the present Embodiment, similarly to Embodiment 3, brightness variation in a panel was suppressed by a lattice-shape auxiliary wiring formed on the upper part transparent electrode, which makes formation by a vapor deposition method using a precise mask easy. In addition, by common use of the upper part electrode of the capacitance and the second current supply line, formation of the wide second current supply line becomes easy.

Embodiment 8

Figure 16:
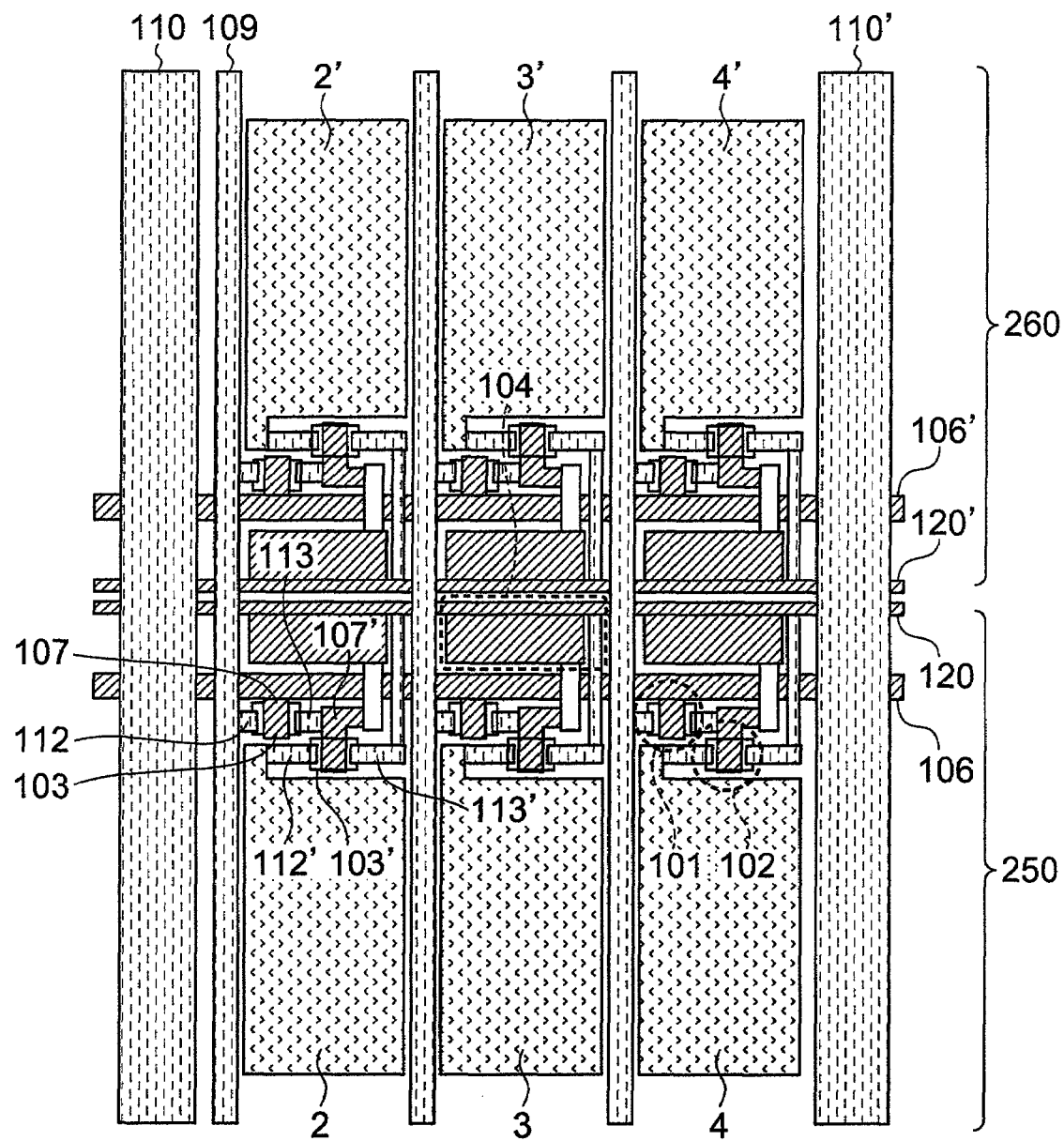
FIG. 16 is a plan view of a pixel in an organic electroluminescence display device (Embodiment 8).

Then, explanation will be given on an Embodiment of other organic electroluminescence display device, with reference to drawings. FIG. 16 is a plan view of pixels of an organic electroluminescence display device. The present Embodiment is characterized in that wiring width of an auxiliary wiring in parallel to a scanning line is widened, by arranging capacitances of adjacent two pixels side by side. A first auxiliary wiring 11 and a second auxiliary wiring 12 corresponding to FIG. 16 are shown in FIG. 17.

Specifically, a first transistor 101, a second transistor 102, a capacitance 104, a signal line 109, a scanning line 106, a first current supply line 110, a second current supply line 120, a first interlayer insulating layer 118, a second interlayer insulating layer 119, lower part electrodes 2 to 4, and a third interlayer insulating layer 151, exist on a glass substrate 116, and an organic luminescence element is formed thereon. A formation method thereof is the same as in Embodiment 3. In addition, on an upper part transparent electrode, first auxiliary wirings 11 and 11' and a second auxiliary wirings 12 are formed. Preparation conditions are the same as in Embodiment 3. Then, sealing is performed by a same method as in Embodiment 3.

As shown in FIG. 16, two pixels were arranged side by side at the upper part and the lower part of the drawing. In a pixel 250 at the lower part of the drawing, in the same way as in Embodiment 3, the lower part electrodes 2, 3 and 4, the scanning line 106, and the capacitance are sequentially formed in this order, from the lower side. On the other hand, in a pixel 260 at the upper part of the drawing, the capacitance, the scanning line 106', and the lower part electrodes 2', 3' and 4' are sequentially formed in this order from the lower side.

Figure 17:
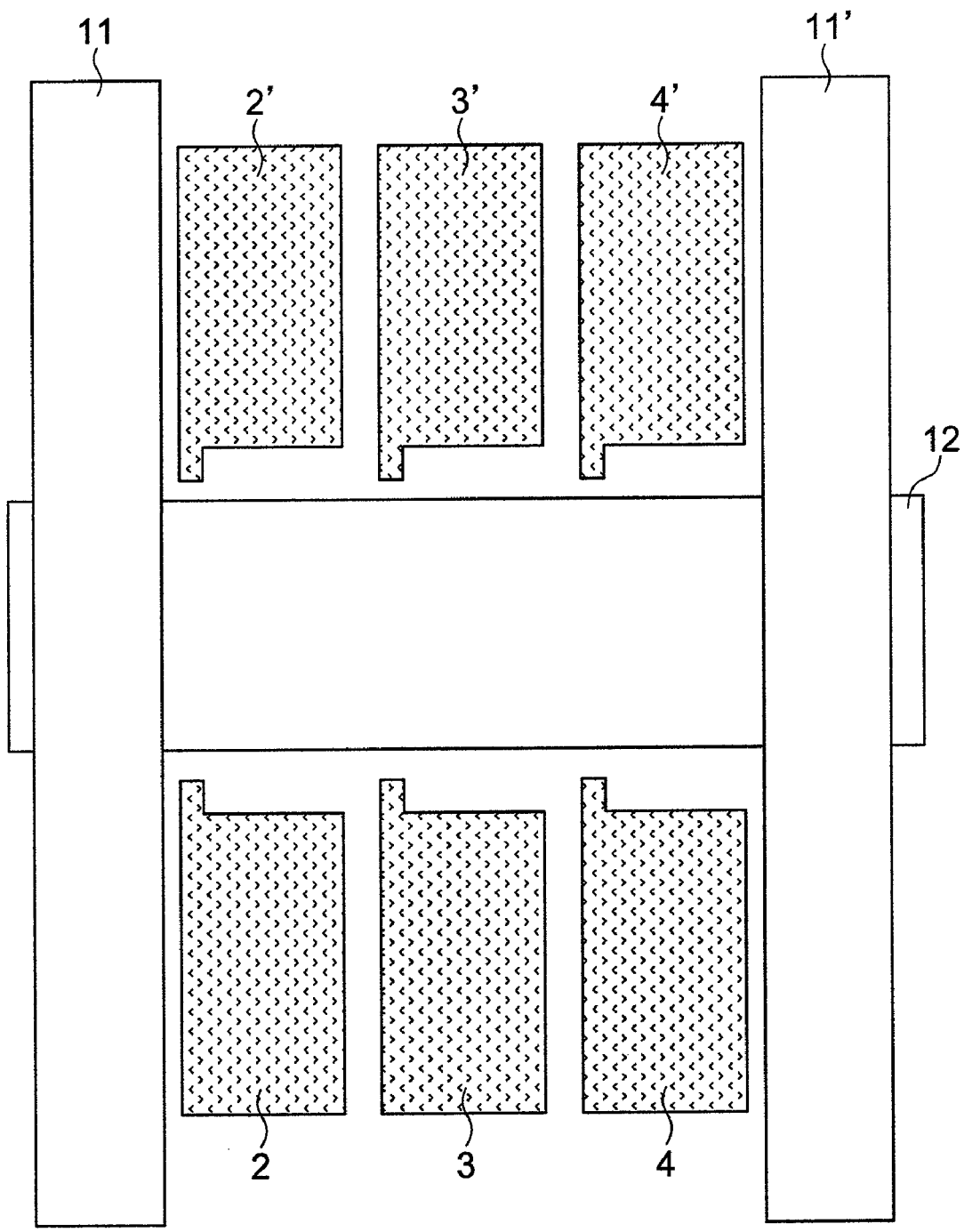
FIG. 17 is a plan view of a pixel in an organic electroluminescence display device (Embodiment 8).

As shown in FIG. 17, the second auxiliary wirings 12 and 12', which are formed and arranged in a direction parallel to the scanning line on an upper part electrode 10, are formed on an area composed of the capacitance and the scanning line. By arranging the capacitances of adjacent two pixels side by side, width of the second auxiliary wiring is widened, and pitch of the second auxiliary wiring is enlarged, which makes formation by a vapor deposition method by using a precise mask easy.

According to the present Embodiment, similarly to Embodiment 3, brightness variation in a panel was suppressed by a lattice-shape auxiliary wiring formed on the upper part transparent electrode, which makes formation by a vapor deposition method using a precise mask easy.

Embodiment 9

Figure 18:
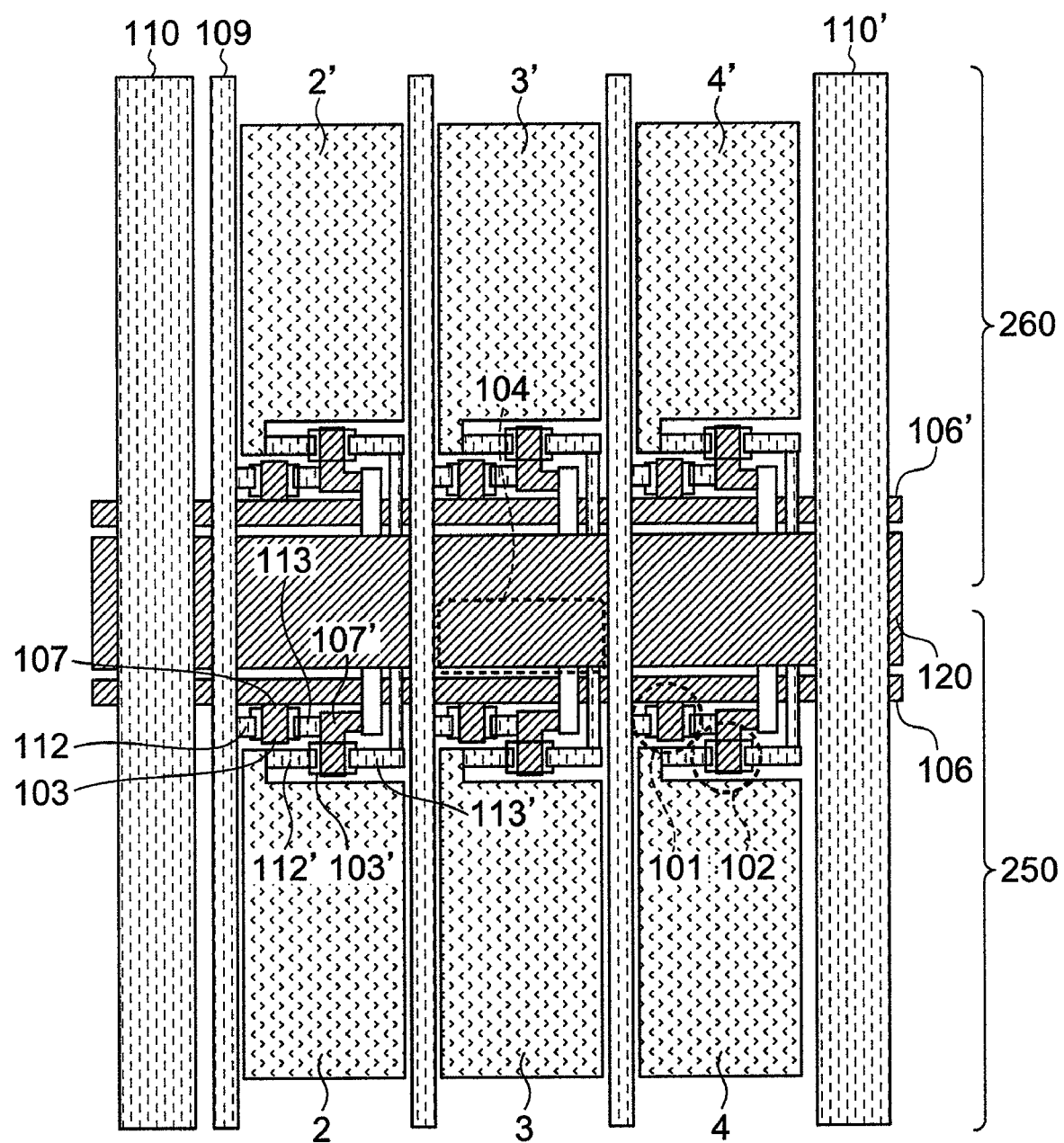
FIG. 18 is a plan view of a pixel in an organic electroluminescence display device (Embodiment 9).

Then, explanation will be given on an Embodiment of other organic electroluminescence display device, with reference to a drawing. FIG. 18 is a plan view of pixels of an organic electroluminescence display device. The present Embodiment is characterized in that wiring width of an auxiliary wiring in parallel to a scanning line is widened, by arrangement of capacitances of adjacent two pixels in a close position, as well as a second current supply line is used in common.

Specifically, a first transistor 101, a second transistor 102, a capacitance 104, a signal line 109, a scanning line 106, a second current supply line 120, a first current supply line 110, a first interlayer insulating layer 118, a second interlayer insulating layer 119, lower part electrodes 2 to 4, and a third interlayer insulating layer 151, exist on a glass substrate 116, and an organic luminescence element, a first auxiliary wiring and a second auxiliary wiring are formed thereon. A formation method and a sealing method thereof are the same as in Embodiment 8.

A capacitance of each pixel and the first current supply lines 110 and 110' are connected by the second current supply line 120.

As shown in FIG. 18, the second current supply line of the capacitance used for a pixel 250 at the lower side, and the second current supply line of the capacitance used for a pixel 260 at the upper side are used in common, resulting in widening the width of the second current supply line 120. In addition, the second current supply line is used as an upper part electrode of each capacitance.

The second auxiliary wirings 12 and 12', which are formed and arranged in a direction parallel to the scanning line on the upper part electrode 10, are formed on an area composed of the capacitance and the scanning line. Width of the second auxiliary wirings can be widened, by arranging capacitances of two pixels in a close position. In addition, pitch of the second auxiliary wiring is set by each two pixels, therefore formation by a vapor deposition method by using a precise mask is made easy. In addition, because of wide width of the second current supply line, a voltage drop by wiring resistance is reduced.

In the present Embodiment, similarly to Embodiment 3, brightness variation in a panel was suppressed by a lattice-shape auxiliary wiring formed on the upper part transparent electrode, which makes formation by a vapor deposition method using a precise mask easy.

Embodiment 10

Figure 19:
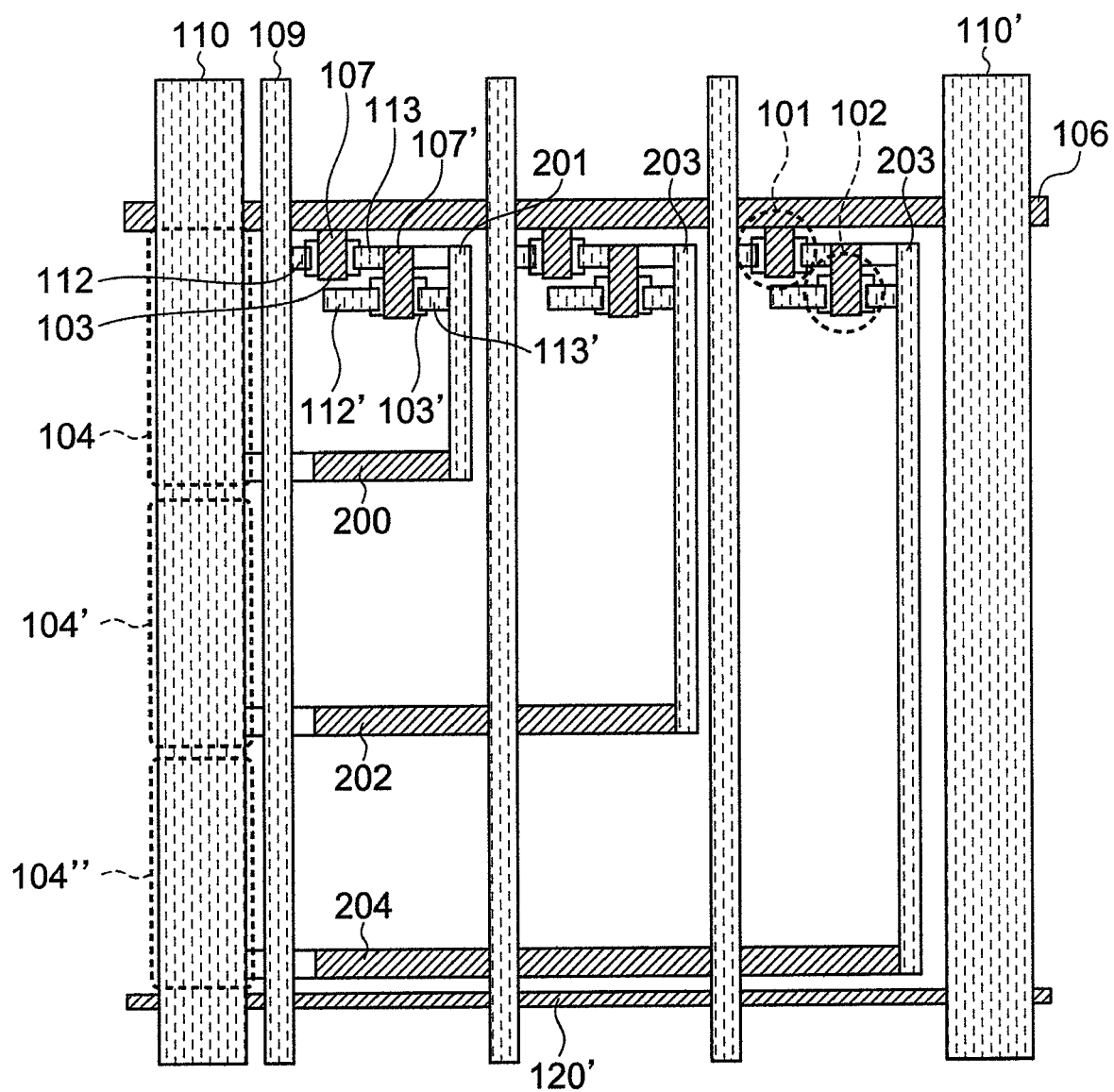
FIG. 19 is a plan view of a pixel in an organic electroluminescence display device (Embodiment 10).
Figure 20:
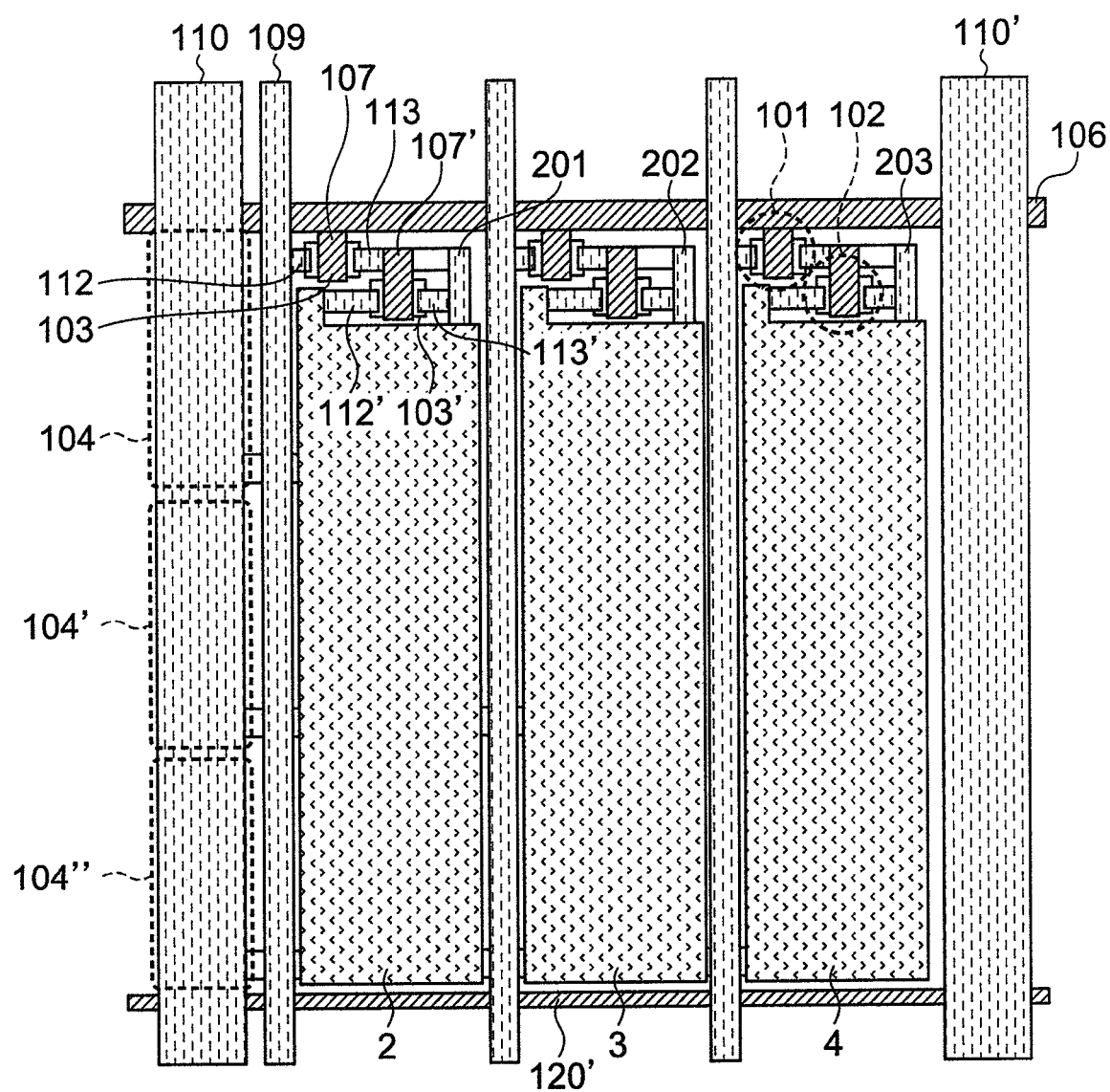
FIG. 20 is a plan view of a pixel in an organic electroluminescence display device (Embodiment 10).

Then, explanation will be given on an Embodiment of an organic electroluminescence display device relevant to the present invention, with reference to drawings. FIG. 19 is a plan view of pixels of an organic electroluminescence display device formed up to a signal line, a first current supply line, a source electrode and a drain electrode. FIG. 20 is a plan view of pixels of an organic electroluminescence display device formed up to a lower part electrode. The present Embodiment is characterized in that the first current supply line and a capacitance of each pixel are arranged by overlapping up and down sides in the same region.

A first transistor 101, a second transistor 102, a signal line 109, a scanning line 106, a first current supply line 110, and a first interlayer insulating layer 118 are formed on a glass substrate 116, and a formation method thereof is the same as in Embodiment 3.

As shown in FIG. 19, a capacitance 104 of each pixel is formed at the lower side of the first current supply line 110. Constitution of the capacitance is the same as in Embodiment 1. For example, at a region of a lower part electrode 2, the lower part electrode of the capacitance prepared by a doping p-Si layer is crossed over by a TiW wiring 200 of the same layer as the scanning line, and is crossed over by an Al wiring 201 of the same layer as the signal line, to be connected to a gate electrode 107' of the second transistor 102, via a wiring prepared by the doping p-Si layer.

At a region of a lower part electrode 3, the lower electrode of the capacitance is crossed over by the TiW wiring 202 and the Al wiring 203, to be connected to the gate electrode of the second transistor. Also at a region of a lower part electrode 4, the lower part electrode of the capacitance is crossed over by the TiW wiring 204 and the Al wiring 205, to be connected to the gate electrode of the second transistor.

A second interlayer insulating layer 119, the lower part electrodes 2 to 4, and a third interlayer insulating layer 151 are formed thereon. Preparation conditions are the same as in Embodiment 1. In addition, an organic luminescence element, a first auxiliary wiring and a second auxiliary wiring formed thereon, and a sealing method are the same as in Embodiment 3.

In the present Embodiment, similarly to Embodiment 3, brightness variation in a panel was suppressed by a lattice-shape auxiliary wiring formed on the upper part transparent electrode, which makes formation by a vapor deposition method using a precise mask easy. In addition, because the first current supply line and the capacitance are overlapped, open area ratio is enhanced.

Embodiment 11

Then, explanation will be given on an Embodiment of an organic electroluminescence display device relevant to the present invention, with reference to a drawing. FIG. 21 is a cross-sectional view of an organic electroluminescence display device relevant to the present invention. The present Embodiment is characterized in that the organic electroluminescence display device is configured by a white color organic electroluminescence element and a color filter formed on a sealing substrate, and a light shielding layer is overlapped on an auxiliary wiring.

Specifically, a first transistor 101, a second transistor 102, a capacitance 104, a signal line 109, a scanning line 106, a second current supply line 120, a first current supply line 110, a first interlayer insulating layer 118, a second interlayer insulating layer 119, lower part electrodes 2 to 4, and a third interlayer insulating layer 151 are provided on a glass substrate 116. Methods of formation of the lower part electrodes 2 to 4 and the third interlayer insulating layer 151 are the same as in Embodiment 3.

Then, a hole transport layer 5 is formed on the lower part electrodes 2 to 4. Preparation conditions are the same as in Embodiment 1. An R luminescence layer 300 and a B luminescence layer 301 are formed thereon. Preparation conditions are the same as in Embodiment 1. The luminescence layers are formed at the front surface of a luminescence area, in the same way as in the hole transport layer. Then, an electron transport layer 9, an electron injection layer, and an upper part electrode 10 are formed on the luminescence layers 300 and 301. Preparation conditions are the same as in Embodiment 1. The organic electroluminescence element exhibits white color luminescence composed of red luminescence color and blue luminescence color.

Then, a first auxiliary wiring 11 and a second auxiliary wiring 12 are formed. Preparation conditions are the same as in Embodiment 3.

Then, a sealing substrate 14 and a TFT substrate 13 are laminated and adhered with pressure. On the sealing substrate 14, an R color filter 302, a G color filter 303, and a B color filter 304 are formed. In addition, between each color filter, a light shielding layer 305 is formed. Curing conditions of a photocurable resin are the same as in Embodiment 1.

In the present Embodiment, similarly to Embodiment 3, brightness variation in a panel was suppressed by a lattice-shape auxiliary wiring formed on the upper part transparent electrode, which makes formation by a vapor deposition method using a precise mask easy. In addition, white color luminescence emitted by the organic electroluminescence element exhibits red, green and blue luminescence through the color filters.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An organic electroluminescence display device, wherein a driving layer comprising a driving element for driving an organic luminescence element, a signal line connected to said driving element, and a wiring layer comprising a scanning line are sequentially laminated on a substrate, comprising:

a first auxiliary wiring extending in a direction parallel to said signal line and a second auxiliary wiring extending in a direction parallel to said scanning line both being provided on an upper part transparent electrode in a pair of electrodes sandwiching an organic layer of said organic luminescence element, wherein said first auxiliary wiring and said second auxiliary wiring are electrically connected, and wherein at least one auxiliary wiring in said first auxiliary wiring and said second auxiliary wiring has an electrical connection layer for electrically connecting with said upper part transparent electrode.

2. The organic electroluminescence display device according to claim 1, wherein a shape of said electrical connection layer is the same as a shape of said first auxiliary wiring or said second auxiliary wiring.

3. The organic electroluminescence display device according to claim 1, wherein said electrical connection layer is formed between said upper part transparent electrode and said first auxiliary wiring, or between said upper part transparent electrode and said second auxiliary wiring.

4. The organic electroluminescence display device according to claim 3, wherein said first or second auxiliary wiring having said electrical connection layer is provided between said upper part transparent electrode and the other auxiliary wiring not having an electrical connection layer.

5. The organic electroluminescence display device according to claim 1, wherein a luminescence color from said organic luminescence element has at least a blue color, a green color and a red color, and a color conversion layer is provided at the outside of said organic luminescence element.

6. The organic electroluminescence display device according to claim 5, wherein a light shielding layer is provided at the upper part of said first auxiliary wiring and said second auxiliary wiring.

7. An organic electroluminescence display device, wherein a driving layer comprising a driving element for driving an organic luminescence element, a signal line connected to said driving element, and a wiring layer comprising a scanning line are sequentially laminated on a substrate, comprising:

a first auxiliary wiring extending in a direction parallel to said signal line and a second auxiliary wiring extending in a direction parallel to said scanning line both being provided on an upper part transparent electrode in a pair of electrodes sandwiching an organic layer of said organic luminescence element, wherein said first auxiliary wiring and said second auxiliary wiring are arranged so as to surround a plurality of pixels consisting of a plurality of sub-pixels composed of said organic luminescence element, wherein said first auxiliary wiring and said second auxiliary wiring are electrically connected, and wherein a first current supply line is provided at a lower side of a region arranged with said first auxiliary wiring.

8. The organic electroluminescence display device according to claim 7, wherein a space is provided at a lower side of a region arranged with said first auxiliary wiring.

9. The organic electroluminescence display device according to claim 8, wherein said scanning line is provided at a lower side of a region arranged with said second auxiliary wiring.

10. The organic electroluminescence display device according to claim 9, wherein a capacitance is provided at a lower side of a region of a first current supply line for supplying a current to said organic luminescence element.

11. The organic electroluminescence display device according to claim 7, wherein said first current supply line and said driving element for said sub-pixels are electrically connected.

12. The organic electroluminescence display device according to claim 11, wherein a second current supply line for electrically connecting said first current supply line and said driving element, and a capacitance are provided at a region between said second current supply line and said scanning line.

13. The organic electroluminescence display device according to claim 12, wherein a lower part electrode of said capacitance is formed by a metal layer of the same layer as said scanning line, and an upper part electrode of said capacitance is formed by a metal layer of the same layer as said signal line.

14. The organic electroluminescence display device according to claim 12, wherein an upper part electrode of said capacitance is commonly used with said second current supply line.

15. A method of manufacturing said organic electroluminescence display device according to claim 1, wherein a precise vapor deposition mask having stripe-shape patterns is used to form said first auxiliary wiring and said second auxiliary wiring.

16. A method of manufacturing said organic electroluminescence display device according to claim 7, wherein a precise vapor deposition mask having stripe-shape patterns is used to form said first auxiliary wiring and said second auxiliary wiring.

17. The method of manufacturing said organic electroluminescence display device according to claim 16, wherein said first auxiliary wiring and an electrical connection layer thereof are formed, or said second auxiliary wiring and an electrical connection layer thereof are formed, by using said precise vapor deposition mask.

18. The method of manufacturing said organic electroluminescence display device according to claim 16, wherein said first auxiliary wiring and an electrical connection layer thereof are formed, or said second auxiliary wiring and an electrical connection layer thereof are formed, by using said precise vapor deposition mask.

* * * * *